United States Patent
Takada et al.

(10) Patent No.: US 10,310,942 B2
(45) Date of Patent: Jun. 4, 2019

(54) MEMORY SYSTEM

(71) Applicant: Toshiba Memory Corporation, Minato-ku, Tokyo (JP)

(72) Inventors: Marie Takada, Yokohama Kanagawa (JP); Masanobu Shirakawa, Chigasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 58 days.

(21) Appl. No.: 15/459,294

(22) Filed: Mar. 15, 2017

(65) Prior Publication Data

US 2018/0081575 A1  Mar. 22, 2018

Related U.S. Application Data

(60) Provisional application No. 62/396,929, filed on Sep. 20, 2016.

(51) Int. Cl.
| | |
|---|---|
| *G11C 29/00* | (2006.01) |
| *G06F 11/10* | (2006.01) |
| *G06F 12/08* | (2016.01) |
| *G11C 11/56* | (2006.01) |

(52) U.S. Cl.
CPC ...... *G06F 11/1076* (2013.01); *G06F 11/1048* (2013.01); *G06F 12/08* (2013.01); *G11C 11/5642* (2013.01); *G11C 2207/2245* (2013.01); *G11C 2211/5632* (2013.01)

(58) Field of Classification Search
CPC .. G06F 11/1048; G06F 11/10; G06F 11/1064; G06F 11/1032; G06F 11/1008; G11C 7/06; G11C 11/4091; G11C 7/22; G11C 7/24; G11C 11/4078; G11C 7/10; G11C 15/00; G11C 7/1006; G11C 11/406; G11C 11/4096; G11C 2207/108; G11C 2207/002; G11C 2207/065
See application file for complete search history.

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2010/0302850 A1 | 12/2010 | Kim et al. |
| 2011/0284946 A1 | 11/2011 | Kiyotoshi |
| 2012/0069663 A1 | 3/2012 | Itagaki et al. |
| 2012/0268994 A1 | 10/2012 | Nagashima |
| 2012/0307557 A1 | 12/2012 | Itagaki |
| 2013/0148436 A1 | 6/2013 | Kurosawa |
| 2015/0256201 A1 | 9/2015 | Sakurada |

FOREIGN PATENT DOCUMENTS

| | | |
|---|---|---|
| JP | 2011-100519 A | 5/2011 |
| JP | 2013-122804 A | 6/2013 |

*Primary Examiner* — Guerrier Merant
(74) *Attorney, Agent, or Firm* — White & Case LLP

(57) ABSTRACT

A memory system includes: a semiconductor memory device; and a controller. When receiving the first read instruction, the semiconductor memory device issues a strobe signal at a first timing to read data from the first memory cell and the second memory cell. When receiving the second read instruction, the semiconductor memory device sets the first memory cell to a non-read target and reads data from the second memory cell based on a strobe result of the data at the first timing.

20 Claims, 34 Drawing Sheets

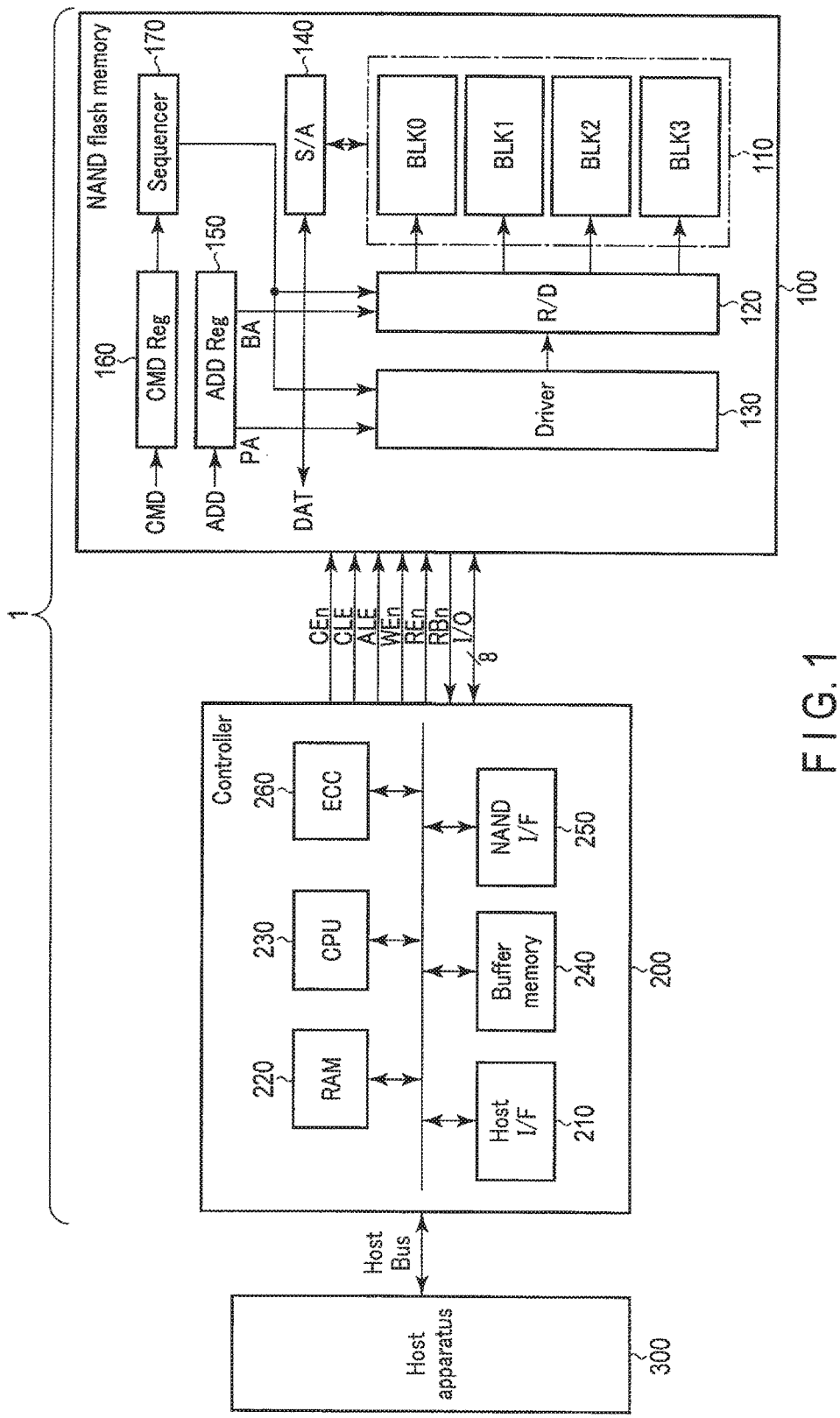
F I G. 1

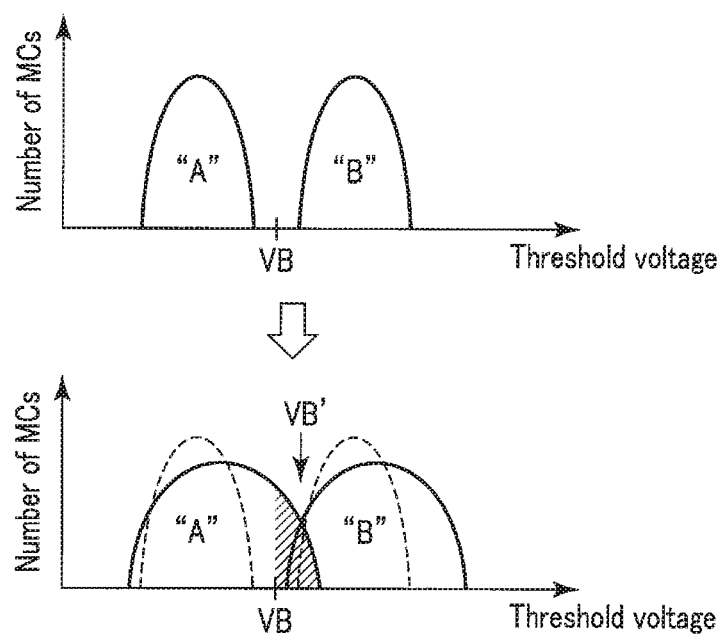
F I G. 7

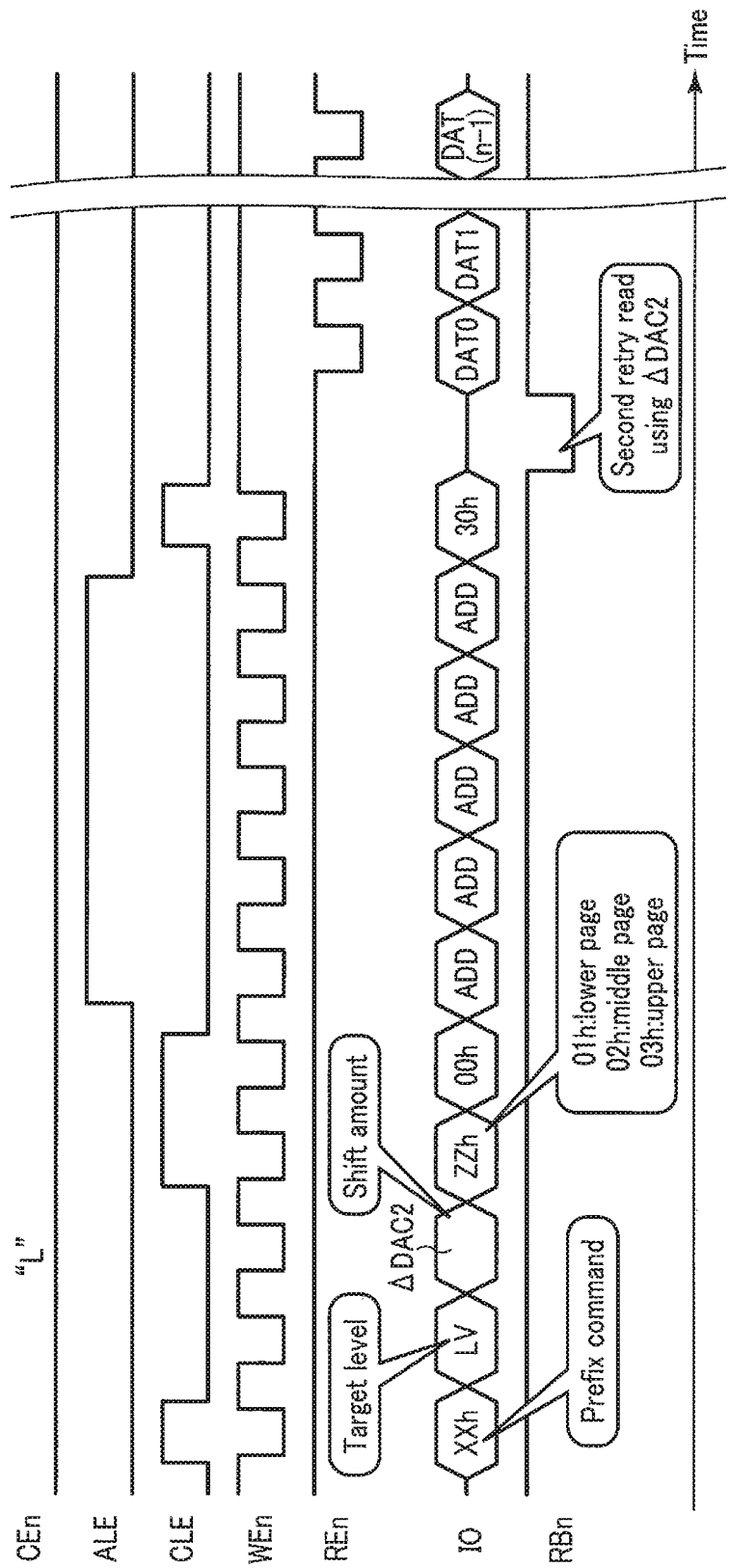
F I G. 12

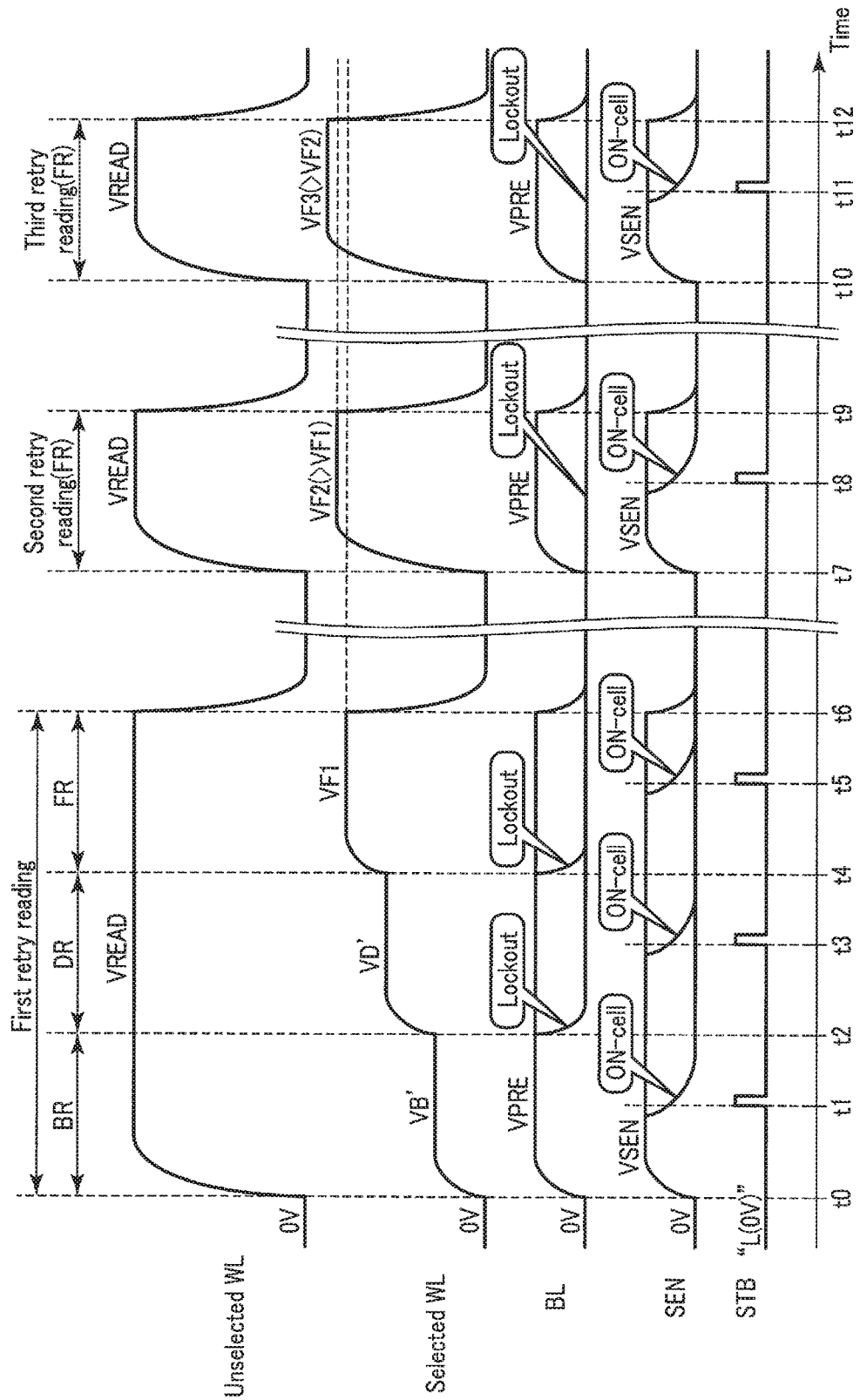
F I G. 13

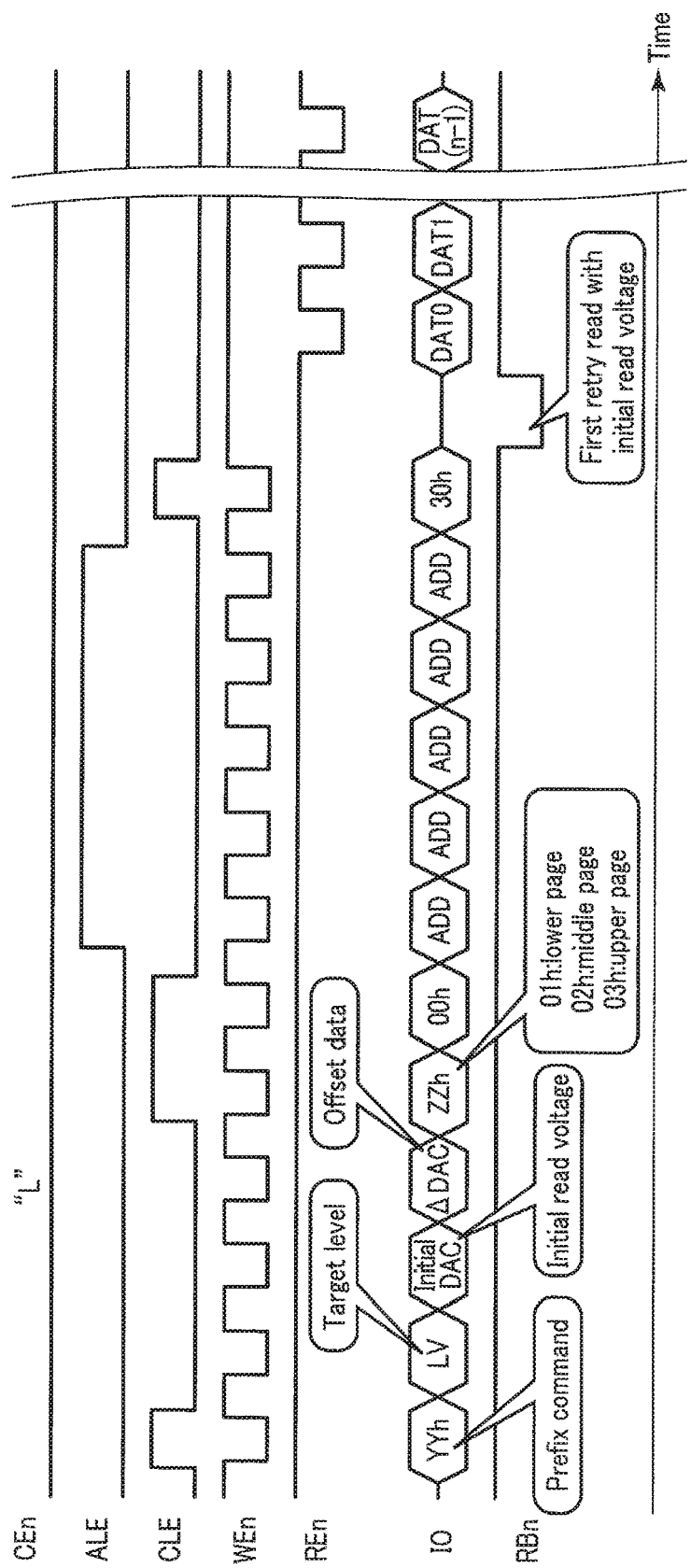
F I G. 16

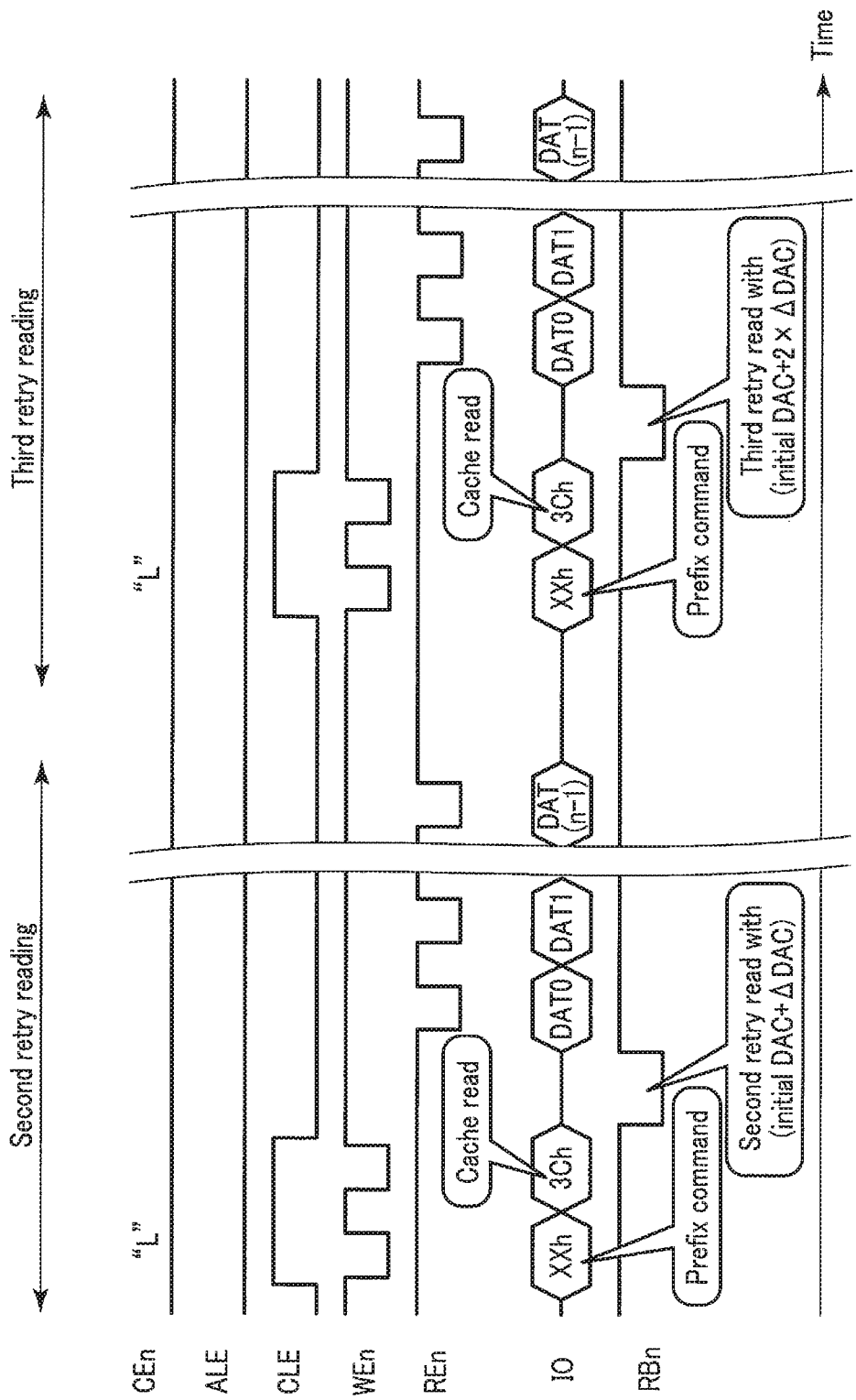
F I G. 17

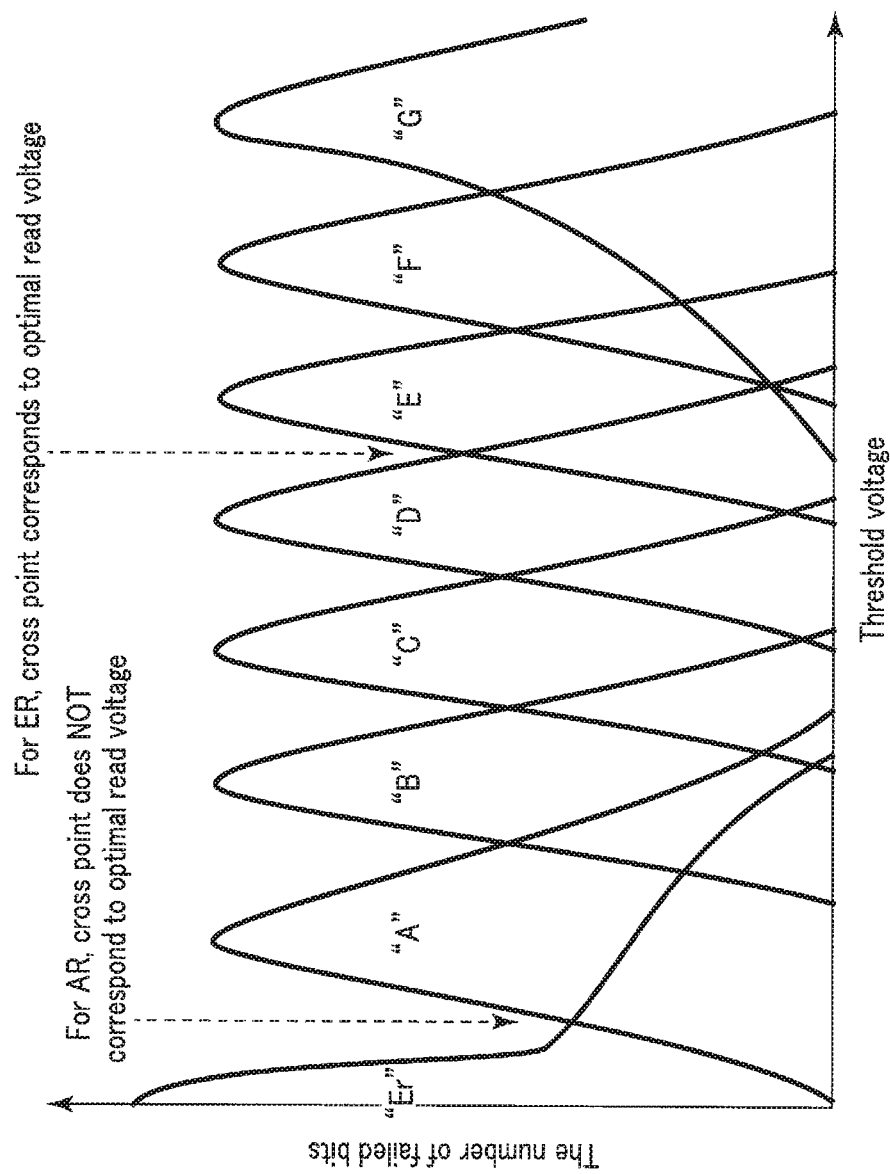
F I G. 43

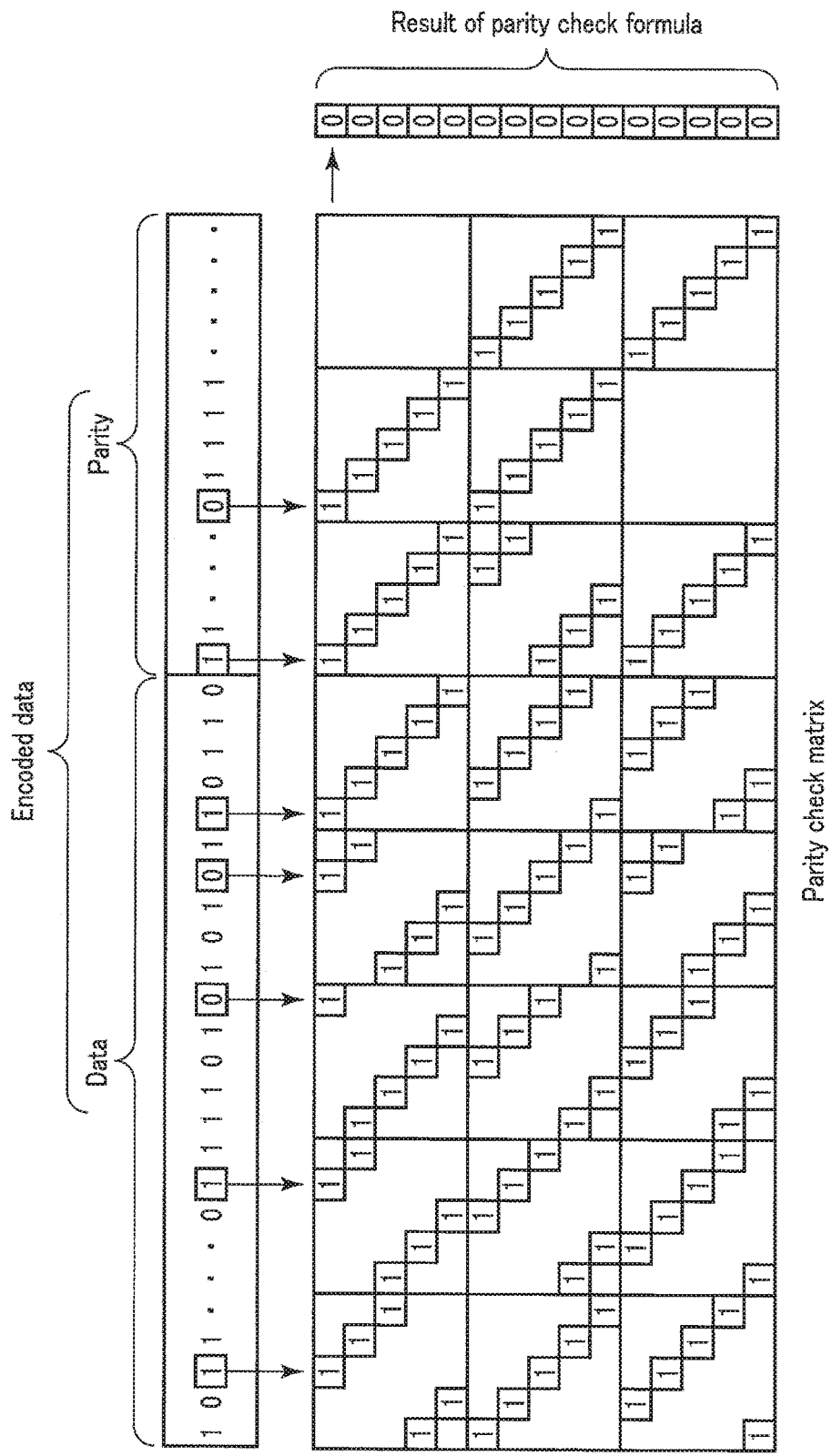
F I G. 47

MEMORY SYSTEM

CROSS-REFERENCE TO RELATED APPLICATIONS

This application claims the benefit of U.S. Provisional Application No. 62/396,929, filed Sep. 20, 2016, the entire contents of which are incorporated herein by reference.

FIELD

Embodiments described herein relate generally to a memory system.

BACKGROUND

A NAND flash memory is widespread as a data storage device.

BRIEF DESCRIPTION OF THE DRAWINGS

FIG. 1 is a block diagram of a memory system according to the first embodiment;

FIG. 7 is a graph showing the threshold distributions of a memory cell;

FIGS. 11 to 15 are timing charts of various signals at the time of execution of shift read tracking according to the first embodiment;

FIGS. 16 and 17 are timing charts of various signals at the time of execution of shift read tracking according to a modification of the first embodiment;

FIG. 43 is a graph showing the threshold distributions of a memory cell;

FIG. 47 is a schematic view showing an error detection method according to the fifth embodiment.

DETAILED DESCRIPTION

Figure 2:
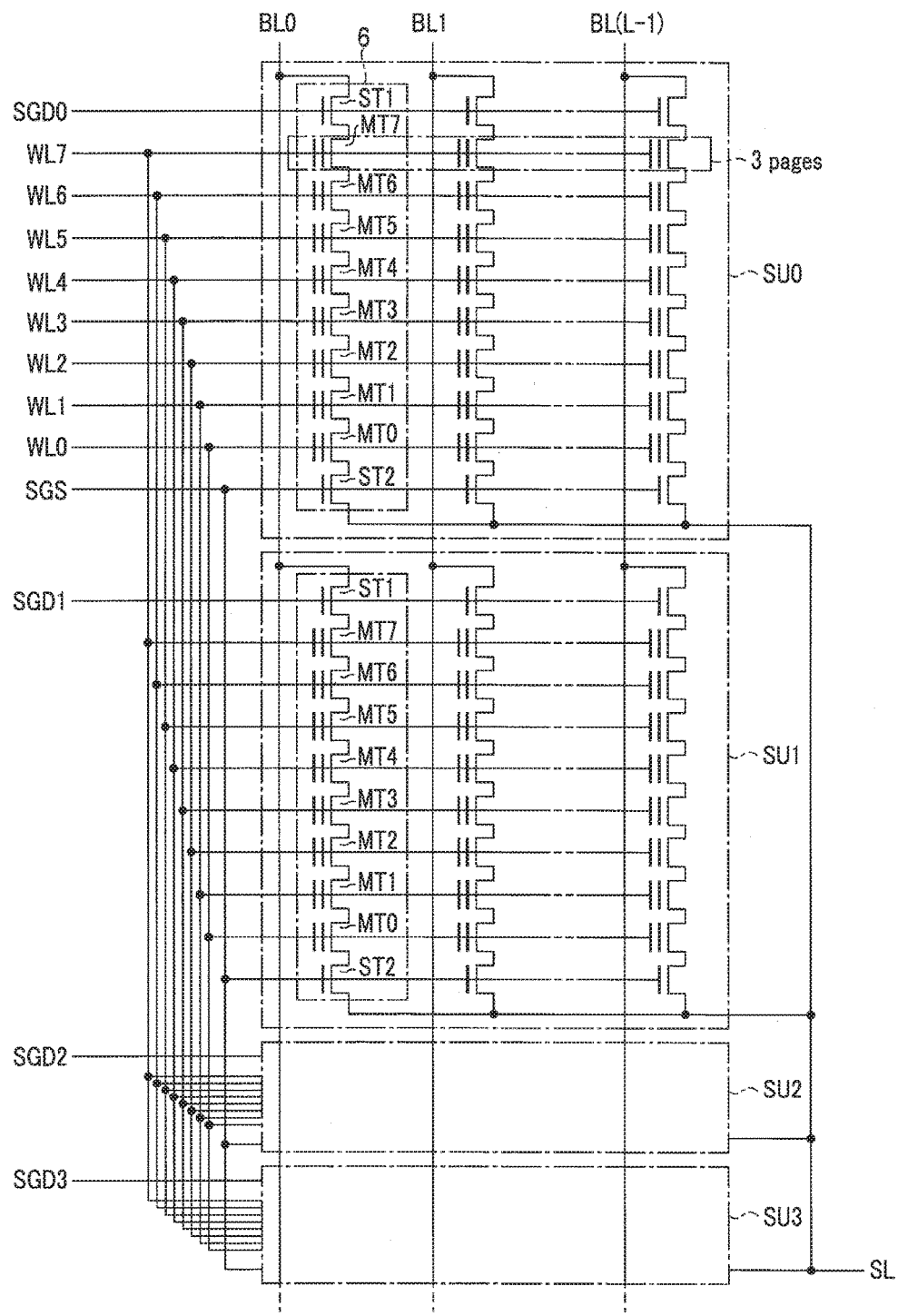
FIGS. 2 and 3 are a circuit diagram and a sectional view, respectively, of a memory cell array according to the first embodiment.

In general, according to one embodiment, a memory system includes: a semiconductor memory device with a memory cell array including a memory cell capable of holding data; and a controller capable of issuing a first read instruction to read data from the semiconductor storage device and a second read instruction different from the first read instruction. The memory cell array includes: a first memory cell and a second memory cell; a first bit line connected to the first memory cell; and a second bit line connected to the second memory cell. When receiving the first read instruction from the controller, the semiconductor memory device applies a first voltage to the first bit line and the second bit line and issues a strobe signal at a first timing to read data from the first memory cell and the second memory cell. When receiving the second read instruction from the controller, the semiconductor memory device applies a second voltage different from the first voltage to the first bit line to set the first memory cell to a non-read target and applies the first voltage to the second bit line to read data from the second memory cell based on a strobe result of the data at the first timing.

1. First Embodiment

A memory system according to the first embodiment will be described. A memory system including a NAND flash memory in which memory cells are three-dimensionally arrayed above a semiconductor substrate will be exemplified below.

1.1 Arrangement 1.1.1 Overall Arrangement of Memory System

An overall arrangement of the memory system according to this embodiment will be described first with reference to FIG. 1. FIG. 1 is a block diagram of the memory system according to this embodiment.

As shown in FIG. 1, a memory system 1 includes a NAND flash memory 100 and a controller 200. The NAND flash memory 100 and the controller 200 may form one semiconductor device by, for example, a combination. Examples of such device are a memory card such as an SD™ card and an SSD (Solid State Drive).

The NAND flash memory 100 includes a plurality of memory cells to store data in a nonvolatile manner. The controller 200 is connected to the NAND flash memory 100 by a NAND bus and connected to a host apparatus 300 by a host bus. The controller 200 controls the NAND flash memory 100, and accesses the NAND flash memory 100 in response to an instruction received from the host apparatus 300. The host apparatus 300 is, for example, a digital camera or a personal computer, and the host bus is, for example, a bus complying with an SD™ interface.

The NAND bus transmits/receives signals complying with a NAND interface. Detailed examples of the signals are a chip enable signal CEn, an address latch enable signal ALE, a command latch enable signal CLE, a write enable signal WEn, a read enable signal REn, a ready busy signal RBn, and an input/output signal I/O.

The signal CEn is a signal used to enable the NAND flash memory 100 and is asserted at a low level. The signals CLE and ALE are signals that notify the NAND flash memory 100 that the input signals I/O to the NAND flash memory 100 are a command and an address, respectively. The signal WEn is a signal asserted at a low level and used to make the NAND flash memory 100 to receive the input signal I/O. The signal REn is also a signal asserted at a low level and used to read the output signal I/O from the NAND flash memory 100. The ready busy signal RBn is a signal representing whether the NAND flash memory 100 is in a ready state (a state in which an instruction from the controller 200 can be received) or a busy state (a state in which an instruction from the controller 200 cannot be received), and the low level represents the busy state. The input/output signal I/O is, for example, an 8-bit signal. The input/output signal I/O is the entity of data transmitted/received between the NAND flash memory 100 and the controller 200 and includes a command, an address, write data, read data, and the like.

1.1.2 Arrangement of Controller 200

Details of the arrangement of the controller 200 will be described next with reference to FIG. 1. As shown in FIG. 1, the controller 200 includes a host interface circuit 210, an embedded memory (RAM) 220, a processor (CPU) 230, a buffer memory 240, a NAND interface circuit 250, and an ECC circuit 260.

The host interface circuit 210 is connected to the host apparatus 300 via the host bus to transfer instructions and data received from the host apparatus 300 to the processor 230 and the buffer memory 240. The host interface circuit 210 also transfers data in the buffer memory 240 to the host apparatus 300 in response to an instruction from the processor 230.

The processor 230 controls the operation of the entire controller 200. For example, upon receiving a write instruction from the host apparatus 300, the processor 230, in response to the instruction, issues a write instruction to the NAND interface circuit 250. This also applies to read and erase. The processor 230 also executes various processes for managing the NAND flash memory 100 such as wear leveling.

The NAND interface circuit 250 is connected to the NAND flash memory 100 via the NAND bus to communicate with the NAND flash memory 100. Based on an instruction received from the processor 230, the NAND interface circuit 250 outputs the signals CEn, ALE, CLE, WEn, and REn to the NAND flash memory 100. Furthermore, in data writing, the NAND interface circuit 250 transfers a write command issued by the processor 230 and write data in the buffer memory 240 to the NAND flash memory 100 as the input signal I/O. Moreover, in data reading, the NAND interface circuit 250 transfers a read command issued by the processor 230 to the NAND flash memory 100 and further receives read data from the NAND flash memory 100 as the output signal I/O, and transfers the read data to the buffer memory 240.

The buffer memory 240 temporarily holds write data or read data.

The embedded-memory 220 is, for example, a semiconductor memory such as a DRAM, and is used as a work area of the processor 230. The embedded-memory 220 holds firmware, various management tables, and the like that are used to manage the NAND flash memory 100.

The ECC circuit 260 executes an error detection and error correction process on read data. During data writing, the ECC circuit 260 generates parities based on net data received from the host apparatus 300. The net data and the parities are written to the NAND flash memory 100. During data reading, the ECC circuit 260 generates a syndrome based on the read parities to determine whether or not the data contains an error. If the data contains an error, the ECC circuit 260 determines the position of the error and corrects the error. However, the number of error bits that can be corrected in the ECC circuit 260 is determined by, for example, the number of parity bits. When the data contains error bits the number of which is larger than the number of error bits that can be corrected, the ECC circuit 260 fails to correct the data, leading to a failure in reading of the data.

1.1.3 Arrangement of NAND Flash Memory 100

1.1.3.1 Overall Arrangement of NAND Flash Memory 100

The arrangement of the NAND flash memory 100 will be described next. As shown in FIG. 1, the NAND flash memory 100 includes a memory cell array 110, a row decoder 120, a driver circuit 130, a column control circuit 140, an address register 150, a command register 160, and a sequencer 170.

The memory cell array 110 includes, for example, four blocks BLK (BLK0 to BLK3) each including a plurality of nonvolatile memory cells associated with rows and columns. The memory cell array 110 stores data given by the controller 200.

The row decoder 120 selects one of the blocks BLK0 to BLK3, and further selects a row direction in the selected block BLK.

The driver circuit 130 applies a voltage to the selected block BLK via the row decoder 120.

In data reading, the column control circuit 140 senses data read from the memory cell array 110 and executes the required calculations. The column control circuit 140 outputs data DAT to the controller 200. In data writing, the column control circuit 140 transfers the write data DAT received from the controller 200 to the memory cell array 110.

The address register 150 holds an address ADD received from the controller 200. The command register 160 holds a command CMD received from the controller 200.

The sequencer 170 controls the operation of the entire NAND flash memory 100 based on the command CMD held by the command register 160.

1.1.3.2 Arrangement of Block BLK

The arrangement of the block BLK will be described next with reference to FIG. 2. FIG. 2 is a circuit diagram of a block BLK.

As shown in FIG. 2, the block BLK includes, for example, four string units SU (SU0 to SU3). Each string unit SU includes a plurality of NAND strings 6. The number of block BLKs in the memory cell array 110 and the number of string units in each block are arbitrary.

Each NAND string 6 includes, for example, eight memory cell transistors MT (MT0 to MT7) and selection transistors ST1 and ST2. Each memory cell transistor MT includes a control gate and a charge accumulation layer and holds data in a nonvolatile manner. The memory cell transistors MT are connected in series between the source of the selection transistor ST1 and the drain of the selection transistor ST2.

The gates of the selection transistors ST1 in the string units SU0 to SU3 are connected to selection gate lines SGD0 to SGD3. On the other hand, the gates of the selection transistors ST2 in the string units SU0 to SU3 are commonly connected to, for example, a selection gate line SGS. The gates of the selection transistors ST2 may be connected to different selection gate lines SGS0 to SGS3 on a string unit basis, as a matter of course. The control gates of the memory cell transistors MT1 to MT7 in the same block BLK are commonly connected to word lines WL0 to WL7, respectively.

The drains of the selection transistors ST1 of the NAND strings 6 on the same column in the memory cell array 110 are commonly connected to a bit line BL (BL0 to BL(L−1), where L is a natural number of 2 or more). That is, the bit line BL commonly connects the NAND strings 6 in the plurality of blocks BLK together. The sources of the selection transistors ST2 are commonly connected to a source line SL.

That is, the string unit SU includes a set of NAND strings 6 connected to different bit lines BL and connected to the same selection gate line SGD. The block BLK includes a set of a plurality of string units SU that share the word lines WL. The memory cell array 110 includes a set of a plurality of blocks BLK that share the bit lines BL.

Figure 3:
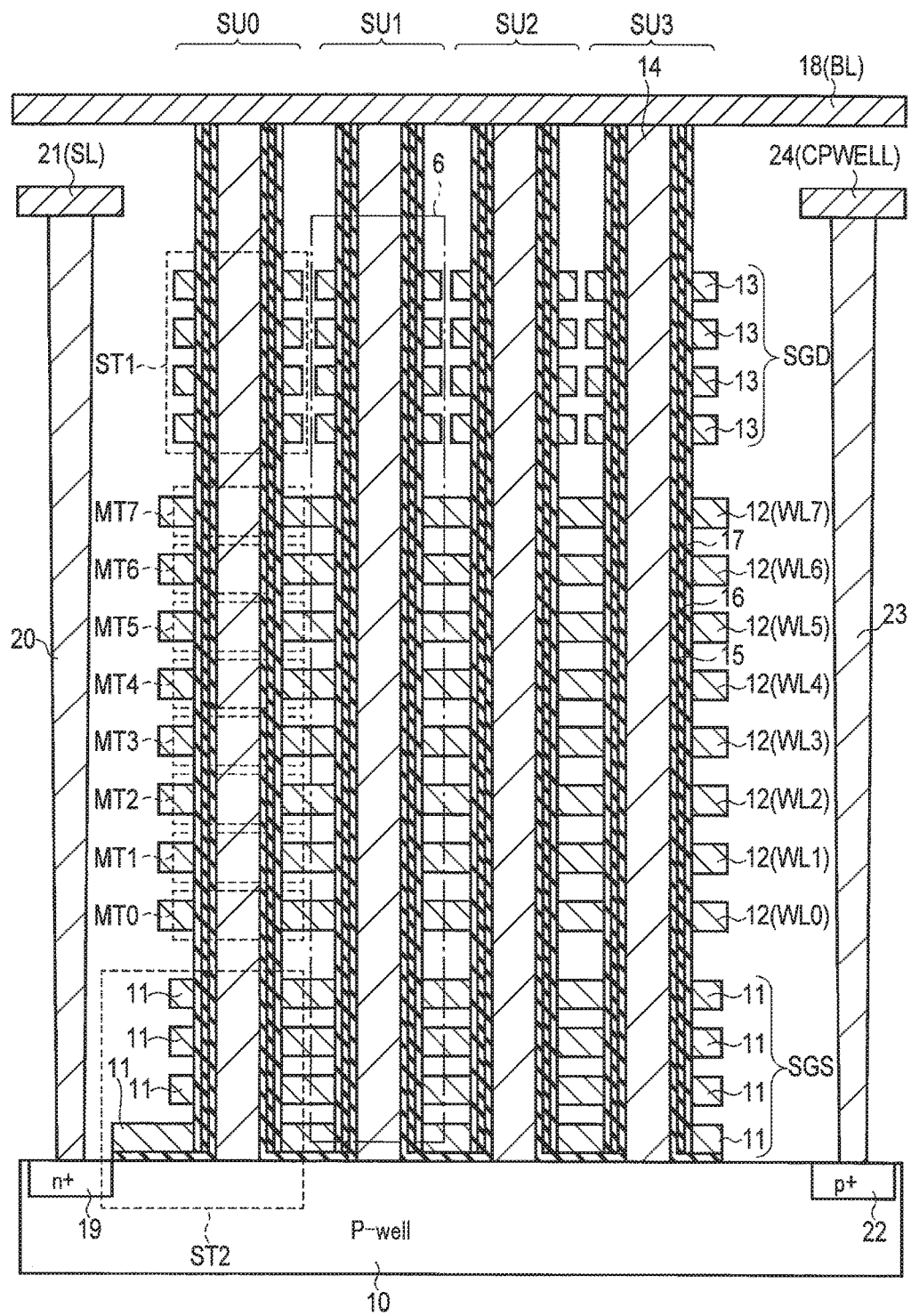

FIG. 3 is a sectional view of a partial region of the block BLK. As shown in FIG. 3, the plurality of NAND strings 6 is formed on a p-type well region 10. That is, for example, four interconnection layers 11 functioning as the selection gate lines SGS, eight interconnection layers 12 functioning as the word lines WL0 to WL7, and, for example, four interconnection layers 13 functioning as the selection gate lines SGD are sequentially tacked above the well region 10. Insulating films (not shown) are formed between the stacked interconnection layers.

Pillar-shaped conductors 14 extending through the interconnection layers 13, 12, and 11 and reaching the well region 10 are formed. A gate insulating film 15, a charge accumulation layer (an insulating film or a conductive film) 16, and a block insulating film 17 are sequentially formed on the side surfaces of the conductors 14. The memory cell transistors MT and the selection transistors ST1 and ST2 are thus formed. Each conductor 14 functions as the current path of the NAND string 6 and the channels of the transistors are formed in the conductor 14. The upper ends of the conductors 14 are connected to a metal interconnection layer 18 functioning as the bit line BL.

An $n^+$-type impurity diffusion layer 19 is formed in the surface region of the well region 10. A contact plug 20 is formed on the diffusion layer 19. The contact plug 20 is connected to a metal interconnection layer 21 functioning as the source line SL in addition, a $p^+$-type impurity diffusion layer 22 is formed in the surface region of the well region 10. A contact plug 23 is formed on the diffusion layer 22. The contact plug 23 is connected to a metal interconnection layer 24 functioning as a well interconnect CPWELL. The well interconnect CPWELL is used to apply a potential to the conductors 14 via the well region 10.

A plurality of arrangements described above is arrayed in the depth direction of the sheet of FIG. 3. The string unit SU is formed by a set of the plurality of NAND strings 6 arranged in the depth direction.

In this example, one memory cell transistor MT can hold, for example, 3-bit data. The bits of the 3-bit data will be referred to as a lower bit, a middle bit, and an upper bit sequentially from the lower side. A set of aggregate of lower bits held by memory cells connected to the same word line will be referred to as a lower page, a set of middle bits will be referred to as a middle page, and a set of upper bits will be referred to as an upper page. That is, three pages are assigned to one word line WL, and the block BLK including eight word lines WL has a capacity of 24 pages. In other words, "page" may be defined as a part of a memory space formed by memory cells connected to the same word line. Data writing and data reading may be executed on a page basis (this read method will be referred to as page-by-page reading).

Data erase may be executed for each block BLK or a unit smaller than the block BLK. An erase method is described in, for example, U.S. patent application Ser. No. 13/235,389 filed on Sep. 18, 2011 and entitled "NONVOLATILE SEMICONDUCTOR MEMORY DEVICE." An erase method is also described in, for example, U.S. patent application Ser. No. 12/694,690 filed on Jan. 27, 2010 and entitled "NONVOLATILE SEMICONDUCTOR STORAGE DEVICE." An erase method is also described in, for example, U.S. patent application Ser. No. 13/483,610 filed on May 30, 2012 and entitled "NONVOLATILE SEMICONDUCTOR MEMORY DEVICE AND DATA ERASE METHOD THEREOF." These patent applications are incorporated by reference in this specification in their entirety.

The memory cell array 110 may have another arrangement. That is, an arrangement of the memory cell array 110 is described in, for example, U.S. patent application Ser. No. 12/407,403 filed on Mar. 19, 2009 and entitled "THREE DIMENSIONAL STACKED NONVOLATILE SEMICONDUCTOR MEMORY." The configuration is also described in U.S. patent application Ser. No. 12/406,524 filed on Mar. 18, 2009 and entitled "THREE DIMENSIONAL STACKED NONVOLATILE SEMICONDUCTOR MEMORY", U.S. patent application Ser. No. 12/679,991 filed on Mar. 25, 2010 and entitled "NONVOLATILE SEMICONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND METHOD FOR MANUFACTURING SAME". These patent applications are entirely incorporated herein by reference.

1.1.3.3 Arrangement of Column Control Circuit 140

Figure 4:
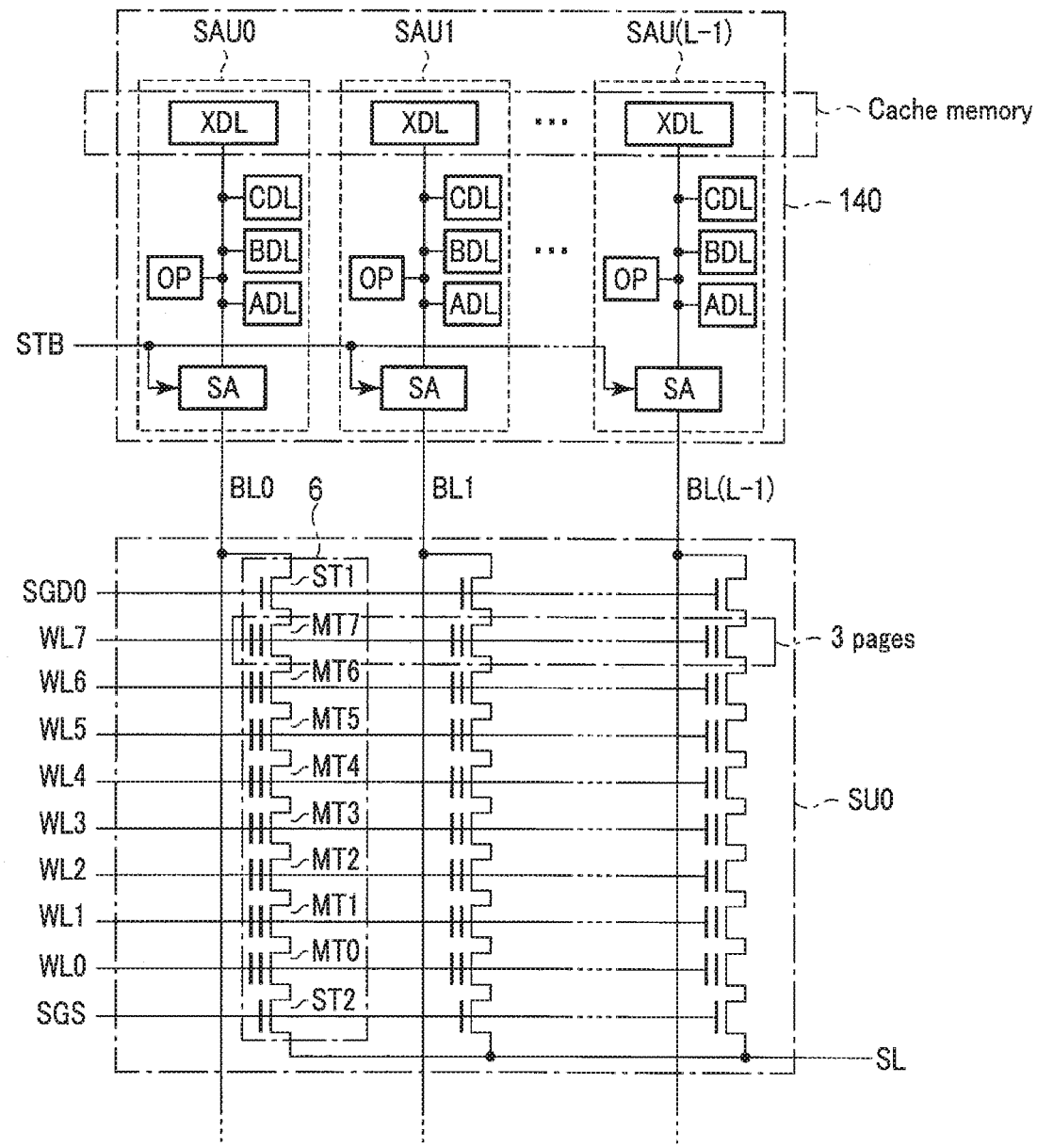
FIG. 4 is a circuit diagram of the memory cell array and a sense amplifier according to the first embodiment.

The arrangement of the column control circuit 140 will be described next with reference to FIG. 4. FIG. 4 is a circuit diagram of the column control circuit 140 and the string unit SU0 according to this embodiment.

As shown in FIG. 4, the column control circuit 140 includes a sense unit SAU (SAU0 to SAU(L−1)) provided for each bit line BL.

Each of the sense units SAU includes a sense amplifier SA, an operation unit OP, and, for example, four latch circuits ADL, BDL, CDL, and XDL.

The sense amplifier SA senses data read onto the corresponding bit line BL, and applies a voltage to the bit line BL in accordance with write data. That is, the sense amplifier SA is a module that directly controls the bit line BL. In data reading, a strobe signal STB is given from, for example, the sequencer 170 to the sense amplifier SA. The sense amplifier SA determines data at the assertion timing of the signal STB (in this example, an ON state of a memory cell is defined as data "0", and an off state is defined as data "1"). This data is held by an internal latch circuit (not shown in FIG. 4) and then transferred to one of the latch circuits ADL, BDL, CDL, and XDL.

The latch circuits ADL, BDL, and CDL temporarily hold read data and write data. The operation unit OP performs various logical operations such as an inversion (NOT) operation, a logical sum (OR) operation, a logical product (AND) operation, and an exclusive OR (XOR) operation for data held by the sense amplifier SA and the latch circuits ADL, BDL, CDL, and XDL.

The sense amplifier SA, the latch circuits ADL, BDL, and CDL, and the operation unit OP are connected by a bus so as to transmit/receive data to/from each other. The bus is further connected to the latch circuit XDL.

Input and output of data to and from the sense amplifier 140 are performed via the latch circuit XDL. That is, data received from the controller 200 is transferred to the latch circuit ADL, BDL, or CDL or the sense amplifier SA via the latch circuit. XDL. In addition, data in the latch circuit ADL, BDL, or CDL or the sense amplifier SA is transmitted to the controller 200 via the latch circuit XDL. The latch circuit XDL functions as the cache memory of the NAND flash memory 100. Hence, even if the latch circuits ADL, BDL, and CDL are in use, the NAND flash memory 100 can be set in a ready state as long as the latch circuit XDL is available.

1.2 Data Read Operation

The read operation of the memory system according to this embodiment will be described next.

1.2.1 Held Data and Threshold Voltage of Memory Cell Transistor

Figure 5:
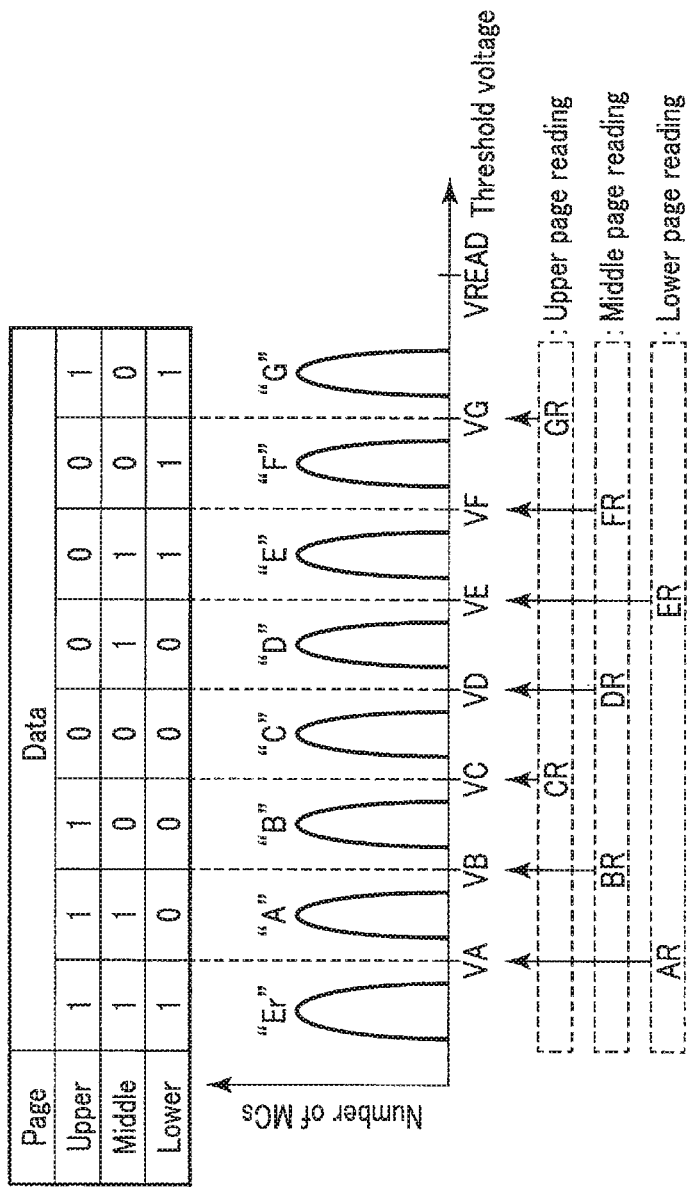
FIG. 5 is a graph showing possible threshold distributions of a memory cell according the first embodiment.

The held data, threshold voltage, and data read levels of the memory cell transistor MT will be described first with reference to FIG. 5. FIG. 5 is a diagram showing data and possible threshold distributions of each memory cell transistor MT and voltages used in reading.

As described above, the memory cell transistor MT can take eight states in accordance with the threshold voltage. The eight states will be referred to as an "Er" state, "A" state, "B" state, "C" state, . . . , and "G" state in ascending order of threshold voltage.

A threshold voltage of the memory cell transistors MT in the "Er" state is lower than a voltage VA and corresponds to a data erase state. A threshold voltage of the memory cell transistors MT in the "A" state is equal to or higher than the voltage VA and lower than a voltage VB (>VA). A threshold voltage of the memory cell transistors MT in the "B" state is equal to or higher than the voltage VB and lower than a voltage VC (>VB). A threshold voltage of the memory cell transistors MT in the "C" state is equal to or higher than the voltage VC and lower than a voltage VD (>VC). A threshold voltage of the memory cell transistors MT in the "D" state is equal to or higher than the voltage VD and lower than a voltage VE (>VD). A threshold voltage of the memory cell transistors MT in the "E" state is equal to or higher than the voltage VE and lower than a voltage VP (>VE). A threshold voltage of the memory cell transistors MT in the "F" state is equal to or higher than the voltage VF and lower than a voltage VG (>VF). A threshold voltage of the memory cell transistors MT in the "G" state is equal to or higher than the voltage VG and is lower than a voltage VREAD. Among the eight states, the "G" state corresponds to data for the highest threshold. Note that VREAD is the voltage applied to an unselected word line in the read operation. This voltage turns on the memory cell transistor MT regardless of held data.

The above-described threshold distributions are obtained by writing the 3-bit (3-page) data formed from a lower bit, a middle bit, and an upper bit. That is, the "Er" state to the "G" state and the lower bit, the middle bit, and the upper bit hold the following relationship.

"Er" state: "111" (the bits are arranged in the order of "upper/middle lower")
"A" state: "110"
"B" state: "100"
"C" state: "000"
"D" state: "010"
"E" state: "011"
"F" state: "001"
"G" state: "101"

Between data corresponding to two adjacent states in the threshold distributions, only one of the three bits changes.

Hence, when reading the lower bit, a voltage corresponding to the boundary where the value ("0" or "1") of the lower bit changes is used. This also applies to the middle bit and the upper bit.

That is, as shown in FIG. 5, when a lower page is read, the voltage VA that discriminates between the "Er" state and the "A" state and the voltage VE that discriminates between the "D" state and the "E" state are used as read levels. Read operations using the voltages VA and VE will be referred to as read operations AR and ER, respectively.

In the read operation AR, it is determined whether the threshold voltage of the memory cell transistor MT is less than the voltage VA. That is, the memory cell transistor MT in the erase state is specified by the read operation AR. In the read operation ER, it is determined whether the threshold voltage of the memory cell transistor MT is less than the voltage VE.

When a middle page is read, the voltage VB that discriminates between the "A" state and the "B" state, the voltage VD that discriminates between the "C" state and the "D" state, and the voltage VF that discriminates between the "E" state and the "F" state are used as read levels. Read operations using the voltages VB, VD, and VF will be referred to as read operations ER, DR, and FR, respectively.

In the read operation BR, it is determined whether the threshold voltage of the memory cell transistor MT is less than the voltage VB. In the read operation DR, it is determined whether the threshold voltage of the memory cell transistor MT is less than the voltage VD. In the read operation FR, it is determined whether the threshold voltage of the memory cell transistor MT is less than the voltage VF.

When an upper page is read, the voltage VC that discriminates between the "B" state and the "C" state and the voltage VG that discriminates between the "F" state and the "G" state are used as read levels. Read operations using the voltages VC and VG will be referred to as read operations CR and GR, respectively.

In the read operation CR, it is determined whether the threshold voltage of the memory cell transistor MT is less than the voltage VC. In the read operation GR, it is determined whether the threshold voltage of the memory cell transistor MT is less than the voltage VG. That is, the memory cell transistor MT in the "G" state is specified by the read operation GR.

1.2.2 Normal Reading

A normal reading operation will be described next. "Normal reading" is a term in contrast with "retry reading" to be described later. When reading data, the controller 200 first executes the normal reading. If the read fails, the controller 200 executes "retry reading (shift read tracking)". The retry reading will be described in detail in sections after 1.2.3. A normal reading operation will be explained here.

Figure 6:
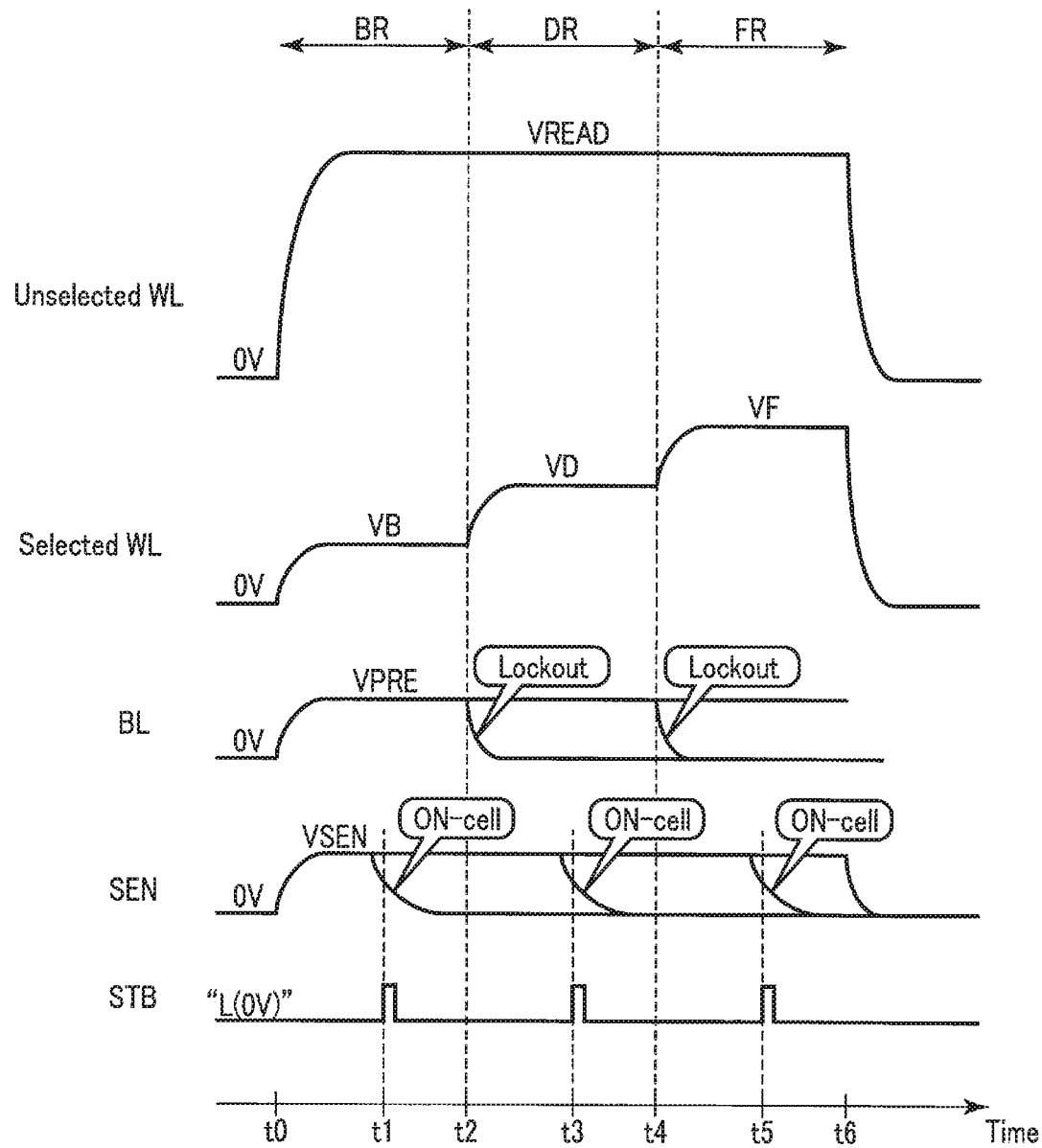
FIG. 6 is a timing chart of various signals in a read operation according to the first embodiment.

FIG. 6 is a timing chart of an unselected word line, a selected word line, the bit line BL, a node SEN, and the signal STB in the NAND flash memory 100 in the normal reading. The node SEN is included in the sense amplifier SA. The potential of the node SEN varies depending on whether the memory cell transistor MT connected to the selected word line changes to the ON state or OFF state. Based on the variation amount, it is determined whether data is "0" or "1". In this example, if the potential of the node SEN is less than a certain threshold, the sense amplifier SA determines that the memory cell transistor MT is turned on, and holds "0" in the internal latch circuit. Conversely, if the potential of the node SEN is kept at a certain potential or more, the sense amplifier SA determines that the memory cell transistor MT is turned off, and holds "1".

FIG. 6 shows an example in which a middle page is read by page-by-page reading.

As shown in FIG. 6, in the middle page reading, the row decoder 120 sequentially applies the voltages VB, VD, and VF to the selected word line WL. During this time, the row decoder 120 applies the voltage VREAD to the unselected word line. The row decoder 120 also applies a voltage VSG to the selection gate lines SGD and SGS (not shown) to turn on the selection transistors ST1 and ST2 in the selected string unit SU. The bit line BL is precharged to a certain potential VPRE by the sense amplifier SA. The node SEN in the sense amplifier SA is also charged to a certain potential VSEN.

In each of the read operations BR, DR, and FR, the sequencer 170 asserts (the logic "H" level in the example of FIG. 6) the signal STB once at a predetermined timing (at time t1, t3, or t5 in the example of FIG. 6).

For example, if the voltage VB is applied to the selected word line WL and then the memory cell transistor MT is turned on, a current flows from the bit line BL to the source line SL. As a result, the node SEN is also discharged, and the potential of the node SEN lowers. The sense amplifier SA asserts the signal STB at a certain timing (time t1) and stores the state of the node SEN in the latch circuit. That is, if the potential of the node SEN lowers, "0" is stored in the latch circuit. If the node SEN holds a predetermined potential or more, "1" is held by the latch circuit (this will be sometimes referred to as data strobe or simply as strobe).

When starting the read operation DR at time t2, the bit line BL to be precharged, in other words, the bit line BL to be read-accessed is decided based on the result of the immediately preceding read operation BR. That is, the bit line BL whose data is determined by the read operation BR is excluded from the read target in the read operation DR. More specifically, each bit line BL whose data strobed at time t1 is "0" is excluded from the read target and fixed to a predetermined voltage (for example, 0 V). This will be referred to as "lockout".

In the read operation DR, the signal STB is asserted at a certain timing (time t3), and data based on the potential of the node SEN is held by the latch circuit, as in the read operation BR. In the read operation FR performed after that, the bit lines BL are locked out based on the strobe results at times t1 and t3.

As described above, the middle page data is determined using three read levels (more specifically, the read voltages VB, VD, and VF).

1.2.3 Retry Reading.

1.2.3.1 Concept of Retry Reading

If data cannot correctly be read by the normal reading described in 1.2.2, that is, if the controller 200 cannot correctly correct an error included in data read from the NAND flash memory 100, the controller 200 executes retry reading. The retry reading will be described below.

In FIG. 5 described above, the threshold distributions of the data are isolated from each other. Hence, data can be discriminated using the voltages VA, VB, VC, . . . , and VG.

However, the threshold of the memory cell transistor MT varies due to the influence of various disturbances or the like. As a result, as for the threshold distribution of each data in FIG. 5, the distribution width may increase, or the distribution may move so that adjacent distributions may overlap. FIG. 7 shows this state. In FIG. 7, for example, assume that the threshold distributions of the "A" state and the "B" state immediately after write are as shown in the upper view of in FIG. 7. Also assume that the threshold distributions expand as shown in the lower view of FIG. 7 due to a disturbance or the like. If read is performed using the voltage VB, the read result of the memory cell transistor MT corresponding to the hatched region in the lower view becomes an error. If the number of error bits is more than the number of error-correctable bits of the ECC circuit 260, it is impossible to correctly correct the data.

In this case, the controller 200 repeats the read operation while shifting a read voltage VCGRV applied to the selected word line. This is retry reading. In this example, focus is placed on one of the plurality of read levels (the read levels VB, VD, and VF for the middle page) corresponding to the read target page (focused read level will be referred to as a target level). Read is repeated while shifting the voltage corresponding to the target level. The read operation for the target level is the same as the normal read operation except that the read voltage is shifted. This read operation will be referred to as shift reading.

In the retry reading, page data is generated using each read level. The controller 200 performs ECC processing for the page data. At this time, the read voltage is shifted in each retry reading for the target level but not for the remaining non-target levels. The operation of search for the read voltage capable of the ECC processing will be referred to as 1-level shift read tracking. In the 1-level shift read tracking according to this example, data for a non-target level is also read from the memory cell array by the first retry reading. However, the read is omitted from the second retry reading. The data for the non-target level read by the first retry reading is used for the second and subsequent retry reading, thereby generating page data.

An optimal read voltage for the non-target level is searched for before the 1-level shift read tracking is performed. The optimal read voltage is a voltage corresponding to the cross point between adjacent threshold distributions. In the example shown in the lower view of FIG. 7, the optimal read voltage is a voltage VB' shifted from the voltage VB to the high voltage side. The cross point between the threshold distributions is searched for using, for example, distribution reading.

1.2.3.2 Overall Procedure of Retry Reading

Figure 8:
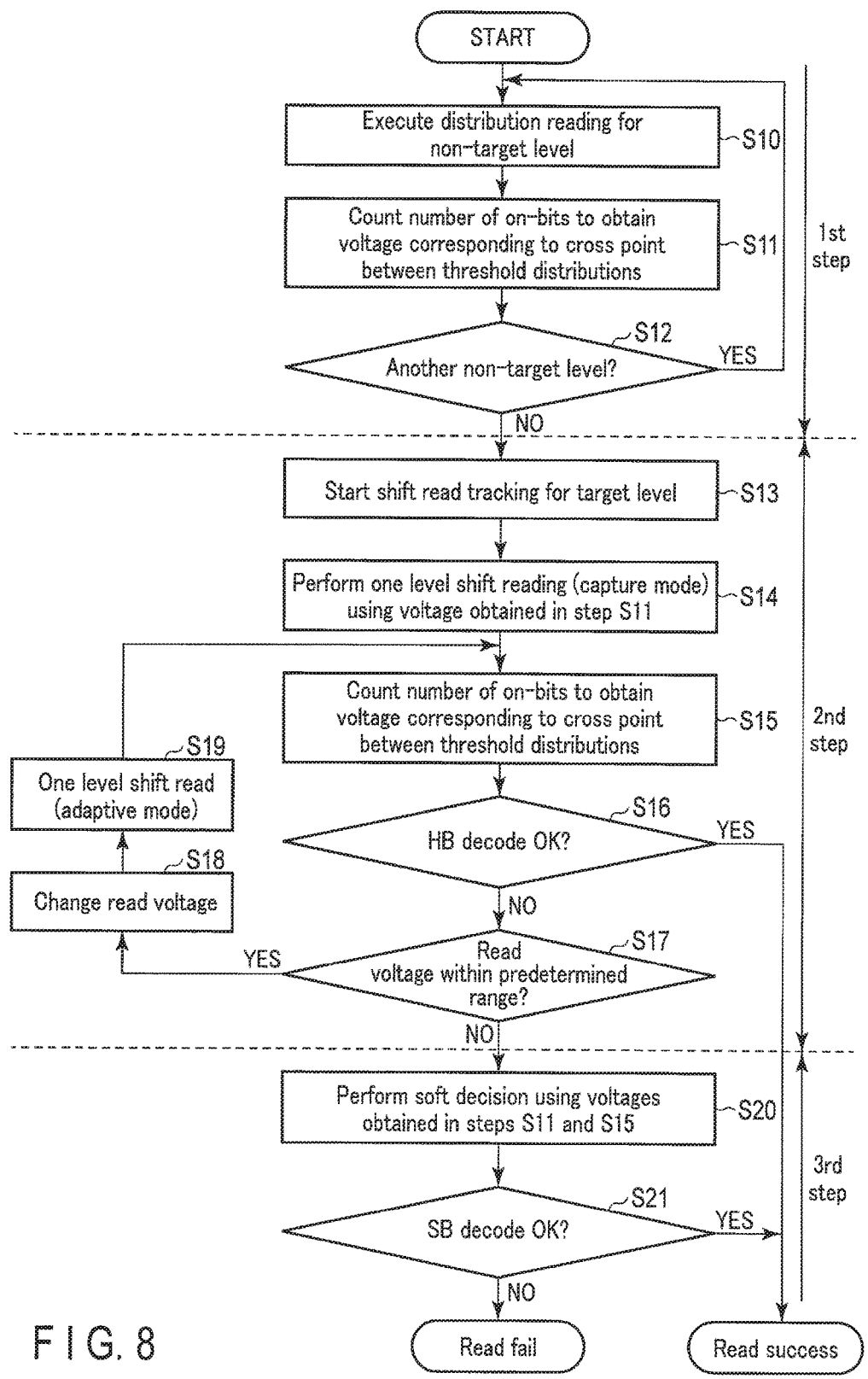
FIG. 8 is a flowchart of a data read operation according to the first embodiment.

The overall procedure of retry reading will be described next with reference to FIG. 8. FIG. 8 illustrates an operation performed when error correction has failed in the normal read operation. As shown in FIG. 8, this operation roughly includes three steps. The first step is a search for the cross point between the threshold distributions by distribution reading, the second step is 1-level shift read tracking, and the third step is a soft decision operation. The steps will sequentially be explained below.

<First Step>

The first step will be described first. As shown in FIG. 8, in the first step, distribution reading is executed for a non-target level ((step S10). The processor 230 of the controller 200 counts the number of on-bits in the distribution reading, and estimates a voltage corresponding to the cross point between the threshold distributions (step S11). The processes of steps S10 and S11 are executed for all non-target levels (step S12). That is, for example, if the middle page is the read target, and the target level is VF, the voltage VB' corresponding to the cross point between the threshold distribution of the "A" state and the threshold distribution of the "B" state and a voltage VD' corresponding to the cross point between the threshold distribution of the "C" state and the threshold distribution of the "D" state are detected.

Figure 9:
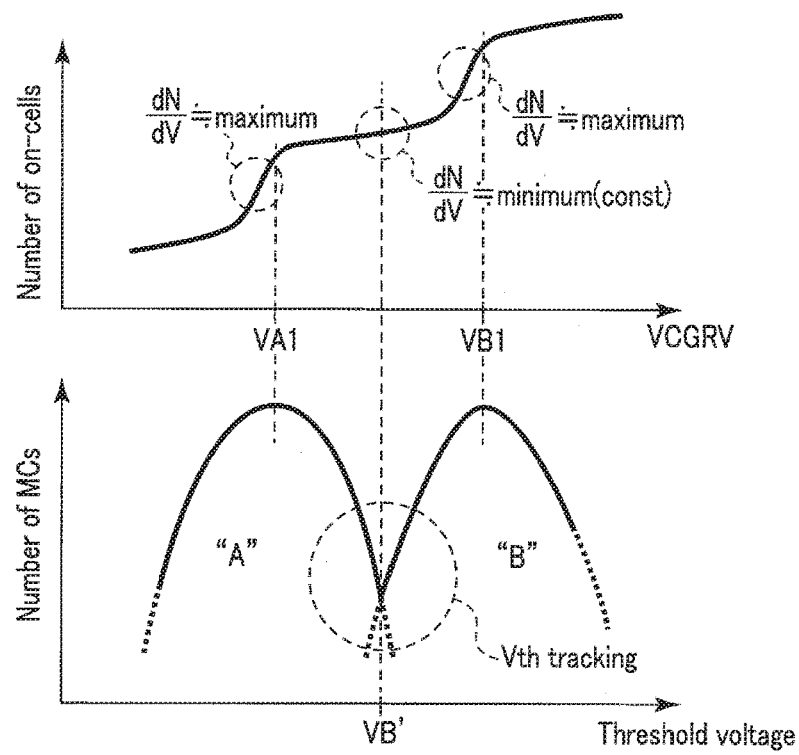
FIGS. 9 and 10 are graphs showing the concept of distribution reading according to the first embodiment, which show a change in the number of on-cells with respect to a word line voltage and threshold distributions.

The concept of the threshold distribution cross point searching method by distribution reading will be described with reference to FIGS. 9 and 10. FIG. 9 is a graph showing the number of on-cells (the cumulative value of the number of memory cells in the ON state) with respect to the voltage VCGRV applied to a selected word line, and the threshold distribution of the "A" state and the threshold distribution of the "B" state corresponding to the graph showing the number of on-cells.

As shown in the upper view of FIG. 9, when the voltage VCGRV of the selected word line is raised, the number of on-cells abruptly increases, and dN/dV is maximized (where N is the number of on-cells, and V is the voltage of the selected word line) at a voltage slightly lower than a voltage VA1 that is the median (the voltage of the highest distribution probability) in the "A" state. When the voltage VCGRV is further increased, the increasing rate of the number of on-cells becomes small, and dN/dV is minimized for a certain value. The increasing rate for the voltage VCGRV is zero if the threshold distribution of the "A" state and the threshold distribution of the "B" state do not overlap. On the other hand, if the threshold distributions overlap, the increasing rate has a predetermined minimum value (>0) that is not zero. When the voltage VCGRV is further increased, the increasing rate of the number of on-cells becomes large again, and dN/dV is maximized again at a voltage slightly lower than a voltage VB1 that is the median in the "B" state.

Threshold distributions as shown in the lower view of FIG. 9 can be obtained based on a change in the cumulative value of the number of on-cells. That is, threshold distributions in which voltages slightly higher than voltages at which dN/dV is maximized are the medians in the "A" state and the "B" state, and a voltage at which dN/dV is minimized corresponds to the cross point between the "A" state and the "B" state are obtained. The voltage of the cross point, that is, the voltage VCGRV at which the increasing rate of the cumulative value of the number of on-cells is minimized is the voltage VB' to be found.

Figure 10:
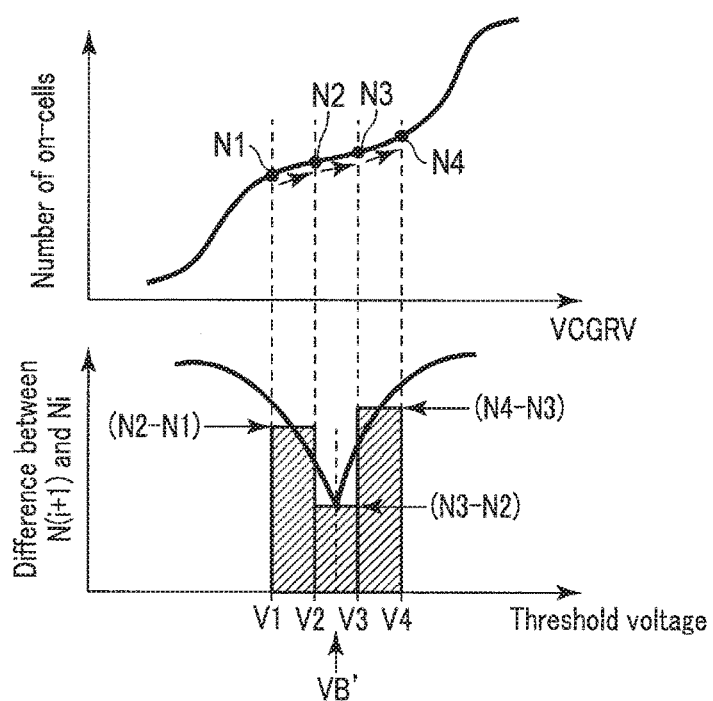

FIG. 10 shows a case in which the voltage of the cross point between the "A" state and the "B" state is searched for, that is, an example in which an appropriate value of the voltage VB is searched for. The upper view of FIG. 10 shows the number of on-cells (the total number of memory cells in the ON state) with respect to the voltage VCGRV of the selected word line WL. The lower view of FIG. 10 shows a histogram representing the number of memory cells that are turned on for the first time when the voltage of the word line WL is changed by only one step and a threshold distribution obtained by the histogram.

As shown in FIG. 10, the read operation is performed using a voltage V1 shifted from the voltage VB used at the time of normal read command issuance by only a predetermined amount. The number of on-cells at this time is N1. Next, the read operation is performed using a voltage V2 shifted from the voltage V1 by only ΔVB in the positive direction. The number of on-cells at this time is N2. The number of memory cells newly turned on when the voltage of the selected word line rises from V1 to V2 is (N2−N1). Subsequently, the controller 200 performs the read operation using a voltage V3 shifted from the voltage V2 by only ΔVB in the positive direction. The number of on-cells at this time is N3. The number of memory cells newly turned on when the voltage of the selected word line rises from V2 to V3 is (N3−N2). If (N2−N1)>(N3−N2), the voltage at which dN/dV=minimum is considered to be higher than at least the voltage V2. Hence, the controller 200 performs the read operation using a voltage V4 shifted from the voltage V3 by only ΔVB in the positive direction. The number of on-cells at this time is N4. If (N4−N3)>(N3−N2), a histogram as shown in the lower view of FIG. 10 is obtained.

As a result, a threshold distribution as shown in the lower view of FIG. 10 is estimated. Based on this distribution, the controller 200 estimates that the point where dN/dV is minimum described with reference to FIG. 9 is located between the voltages V2 and V3, and sets the value between the voltages V2 and V3 to the appropriate read voltage VB'.

The controller further repeats the same operation as described above for the voltage level VD as well, and obtains the appropriate read voltage VD'.

<Second Step>

After the appropriate read voltages for the non-target levels are obtained in the first step, the controller 200 starts 1-level shift read tracking (step S13). The read level selected as the target level corresponds to, for example, a cross point at which the variation amount of the optimal read voltage by a threshold variation is maximized. This is probably because the number of generated error bits increases as the variation amount of the optimal read voltage increases.

The controller 200 instructs the NAND flash memory 100 to execute 1-level shift read tracking in the first mode (step S14). In the first mode, data is read from the memory cell array using all read levels corresponding to the read target page. For example, when the middle page is read, all the read operations BR, DR, and FR are executed. The first mode will sometimes be referred to as a capture mode hereinafter. At the capture mode, in the read operations BR and DR corresponding to the non-target levels, the voltages VB' and VD' obtained by the distribution reading in the first step are used as the read voltage VCGRV. On the other hand, in the read operation FR corresponding to the target level, a voltage designated by the controller 200 is used as the read voltage VCGRV.

Data of one page read from the memory cell array 110 in step S13 is transmitted to the controller 200. In the controller 200, for example, the processor 230 counts the number of on-bits in the read operation (FR in this example) corresponding to the target level, and estimates a voltage corresponding to the cross point between the threshold distributions (the cross point between the threshold distributions of the "E" state and the "F" state in this example) (step S15). Additionally, in the controller 200, the ECC circuit 260 detects and corrects an error by hard decision decoding (hard bit decode) (step S16). If the error can be corrected (YES in step S16), the 1-level shift read tracking is completed.

If the error cannot be corrected in step S16 (NO in step S16), and the read voltage VCGRV has a value within a predetermined range in shift reading (YES in step S17), the processor 230 instructs the NAND flash memory 100 to change the shift amount of the read voltage VCGRV corresponding to the target level (step S18), and instructs the NAND flash memory 100 to execute 1-level shift read tracking again (step S19). However, the 1-level shift read tracking instructed in step S19 is shift read tracking in the second mode different from that of step S14. In the second mode, the read operation is performed by shifting the read voltage (for example, VF) corresponding to the target level among the read levels corresponding to the read target page. In the second mode, the read operations using the read voltages (VB and VD) corresponding to the non-target levels are not performed. This is the second mode which will sometimes be referred to as an adaptation mode hereinafter. In the adaptation mode, data obtained in the capture mode in step S14 is used as read data corresponding to the read voltages (for example, VB and VD) that are not used in the actual read operations. Data of one page is thus obtained.

Data of one page obtained in the NAND flash memory 100 in step S19 is transmitted to the controller 200. In the controller 200, the ECC circuit 260 detects and corrects an error by hard decision decoding (step S16). If the error can be corrected (YES in step S16), the data read succeeds, and the shift read tracking is completed.

If the error cannot be corrected in step S16 (NO in step S16), the controller 200 confirms whether the shift amount in step S18 falls within a predetermined range (step S17). If the shift amount falls within the predetermined range (YES in step S17), the process returns to step S18 to repeat the 1-level shift read tracking in the adaptation mode. If the shift amount falls outside the predetermined range (NO in step S17), the controller 200 determines that the data read by the hard decision is impossible, and advances to the third step. By repeating the 1-level shift read tracking a plurality of times, a histogram as described with reference to FIG. 10 is obtained in step S15. The number of on-bits is held by, for example, the embedded memory 220 in association with the number of times of retry reading or the read voltage VCGRV applied to the selected word line. Note that if the count result of the number of on-bits is directly used, noise may be included. Hence, the noise is reduced by performing, for example, smoothing processing. Then, a histogram as shown in FIG. 10 is created based on the count result after the noise reduction, and the position of the cross point between the threshold distributions corresponding to the target level is determined. Information for designating the voltage VCGRV to be applied to the selected word line at the time of read is given as a digital value from the controller 200 to the NAND flash memory 100. This is a DAC (D/A converter) value. A DAC value corresponding to a cross point position is, for example, a value capable of obtaining $N(n-1)$ that meets both of following conditions.

$$N(n-2) > N(n-1)$$

$$N(n-1) < N(n)$$

where n is the number of times of retry reading, and N(i) is the number of on-bits in the ith retry reading.

<Third Step>

If the data cannot correctly be read by the shift read tracking, the ECC circuit 260 of the controller 200 performs the soft decision processing (step S20). In the soft decision processing, the ECC circuit 260 performs an iterative calculation based on the probability according to a log likelihood ratio (LLR). By this calculation, an error detected and corrected (soft bit decode). The log likelihood ratio LLR is information representing the reliability (probability) of data read by a certain read voltage, and is obtained using a log likelihood ratio table (LLR table).

At the soft bit decoding, the ECC circuit 260 corrects the error using the voltages obtained in steps S11 and S15. That is, data is read a plurality of times near the cross point between the threshold distributions corresponding to the read levels (soft bit read). For example, when reading the middle page, the voltages corresponding to the cross point between the "A" state and the "B" state and the cross point between the "C" state and the "D" state are obtained in step S11, and the voltage corresponding to the cross point between the "E" state and the "F" state is obtained in step S15. Hence, for each read level, for example, the read voltage VCGRV is changed in the positive and negative directions with respect to the voltages obtained in these steps as the center.

If the data decoding succeeds as the result of step S20 (YES in step S21), the read operation succeeds, and the processing ends. If the data decoding fails (NO in step S21), another correction method is applied, or the read fails.

1.2.3.3 Command Sequence of 1-Level Shift Read Tracking

Figure 11:
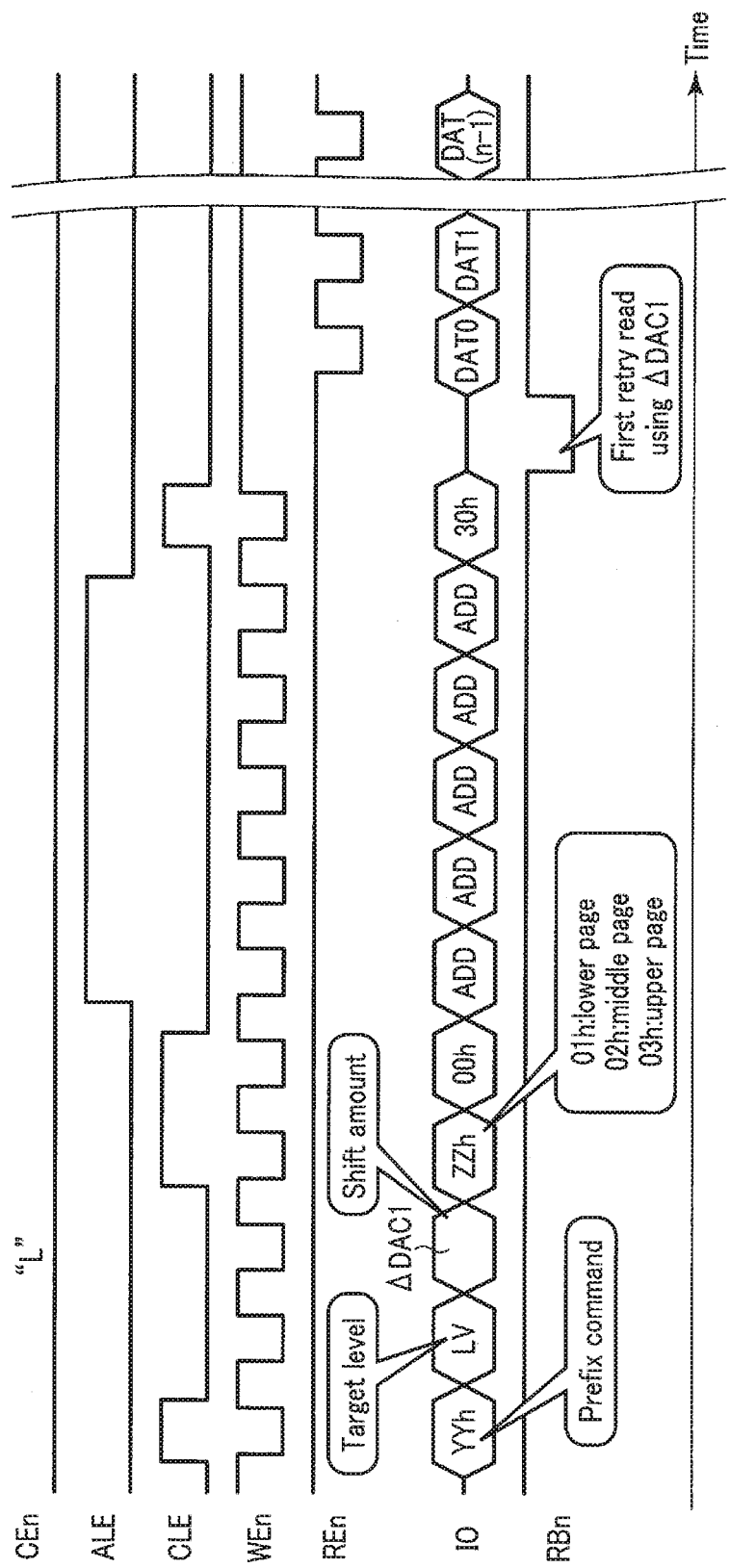

FIGS. 11 and 12 are timing charts of various signals transmitted/received on the NAND bus at the time of execution of 1-level shift read tracking (at the time of execution of the second step) described with reference to FIG. 8. FIG. 11 shows 1-level shift reading in the capture mode in step S14. FIG. 12 shows 1-level shift reading in the adaptation mode in step S19 repeated after FIG. 11.

First, the command sequence when executing 1-level shift reading in the capture mode will be described with reference to FIG. 11.

As shown in FIG. 11, when the capture mode is selected, the controller 200 issues a prefix command "YYh". "YYh" is a command used by the controller 200 to declare to execute 1-level shift reading in the capture mode to the NAND flash memory 100. Next, the controller 200 issues information (read level LV) representing a read voltage as a search target. This information may designate the read voltage itself or the read order in each page. The controller 200 also issues offset data ΔDAC1 corresponding to the shift amount of the voltage VCGRV corresponding to the target level. Information for designating the voltage VCGRV to be applied to the selected word line in reading is given as a digital value from the controller 200 to the NAND flash memory 100. This is the DAC value. ΔDAC1 represents, for example, a shift amount with respect to the voltage used in the normal reading.

In addition, the controller 200 issues a command "ZZh". "ZZ" is a variable. For example, if "ZZh"="01h", lower page reading is instructed. If "ZZh"="02h", middle page reading is instructed. If "ZZh"="03h", upper page reading is instructed. Hence, for example, if the information LV for designating the read level designates "third time", and "ZZh"="02h", the voltage VF used to read "F" data to be read for the third time in middle page reading is the search target.

After that, as in the normal read operation, the controller 200 issues a first read command "00h", and subsequently issues addresses (including a column address, a block address, and a page address) in, for example, five cycles. Then, the controller 200 issues a second read command "30h".

If the command "30h" set in the command register 160, the NAND flash memory 100 starts the data read operation from the memory cell array 110 and changes to the busy state. Data of one page is read from an area corresponding to the address transmitted from the controller 200 and held by the latch circuit XDL.

After that, when the NAND flash memory 100 changes to the ready state, the controller 200 repetitively asserts the signal /RE. Every time the signal /RE is toggled, data read from the memory cell array 110 is transmitted to the controller 200.

Note that in the above command sequence, to input a command to the NAND flash memory 100, the controller 200 asserts the signal CLE. To input an address, the controller 200 asserts the signal ALE. To input data, the controller 200 negates the signals CLE and ALE. To input a certain signal to the NAND flash memory 100, the controller 200 toggles the signal WEn.

Next to the capture mode, 1-level shift reading in the adaptation mode is then executed. At this time, as shown in FIG. 12, the controller 200 first issues a prefix command "XXh". "XXh" is a command used by the controller 200 to declare to execute 1-level shift reading in the adaptation mode to the NAND flash memory 100. After that, as in FIG. 11, the read level LV, offset data ΔDAC2, and the command "ZZh" are issued, and the command "00h", the address ADD, and the command "30h" are issued. According to this method, every time 1-level shift reading is performed in the adaptation mode, the controller 200 can freely set the read voltage VCGRV corresponding to the level of interest by ΔDAC2.

1.2.3.4 Details of Operation of NAND Flash Memory 100

Details of the operation of the NAND flash memory 100 that has received the commands described in the above command sequences will be described next.

FIG. 13 shows a state of shift read tracking in a case in which the voltage VF used to determine the "F" data, which is read thirdly in the middle page in FIGS. 11 and 12, is the search target.

First, when "YYh" is set in the command register 160, the sequencer 170 of the NAND flash memory 100 grasps that the 1-level shift reading instruction in the capture mode is received. The search target information LV and information such as ΔDAC are held by, for example, the register in the sequencer 170. In response to the setting of the command "30h" in the command register 160, the sequencer 170 executes the first retry reading in the capture mode.

That is, the row decoder 120 selects the word line WL corresponding to the address signal ADD, and sequentially applies the voltages VB', VD' and VF1 to the selected word line. The voltages VB' and VD' has values found by distribution reading explained in the steps S10 to S12 of FIG. 8. The voltage VF1 is a voltage corresponding to ΔDAC1 described with reference to FIG. 11, and corresponds to the initial value of the voltage VF when repeating retry reading. The rest is almost the same as in the normal reading described with reference to FIG. 6.

However, unlike the normal reading, a strobe result of data obtained when the voltage VD' applied to the selected word line immediately before the voltage VF1 that is the search target is used is held by one (for example, BDL in this example) of the latch circuits ADL, BDL, and CDL, and strobe results obtained when the voltages VB' and VD' other than the voltage VF are applied are held by one (for example, ADL in this example) of the latch circuits ADL, BDL, and CDL. These data items are held by the latch circuits ADL and BDL even after the end of the first retry reading (t0 to t6).

Next, the second retry reading is performed. When the command "XXh" is set in the command register 160, the sequencer understands that the 1-level shift reading instruction in the adaptation mode is received. The search target and ΔDAC are determined based on the information held by the register in the sequencer 170 unless the pieces of information are cleared (in other words, unless "YYh" is received anew).

As shown in FIG. 13, in the second retry reading, the row decoder 120 applies not the voltages VB' and VD' as the non-search target but a voltage VF2 obtained by shifting the voltage VF as the search target from the initial value VF1 to the selected word line. The value of the voltage VF corresponds to ΔDAC2. The column control circuit 140 locks out the bit lines BL based on the data held by the latch circuit BDL. That is, the bit lines BL corresponding to the memory cell transistors MT whose data is determined based on the strobe results at times t1 and t3 are locked out, and the remaining bit lines BL are precharged to the voltage VPRE.

In a state in which the voltage VF2 is applied to the selected word line, the signal STB is asserted, and data is strobed. After that, the column control circuit 140 generates middle page data based on the strobe result at time t8 and the data held by the latch circuit ADL, and transmits it to the controller 200.

The third retry reading is performed in the same way. As shown in FIG. 13, the row decoder 120 does not apply the voltages VB and VD as the non-search target to the selected word line, but shifts the voltage VF as the search target from VF2 to VF3. The column control circuit 140 locks out the bit lines BL based on the data held by the latch circuit BDL. That is, the bit lines BL corresponding to the memory cell transistors MT whose data are determined based on the strobe results at times t1 and t3 are locked out, and the remaining bit lines BL are precharged to the voltage VPRE.

In a state in which the voltage VF3 is applied to the selected word line, the signal STB is asserted, and data is strobed. After that, the column control circuit 140 generates middle page data based on the strobe result at time t11 and the data held by the latch circuit ADL, and transmits it to the controller 200.

Figure 14:
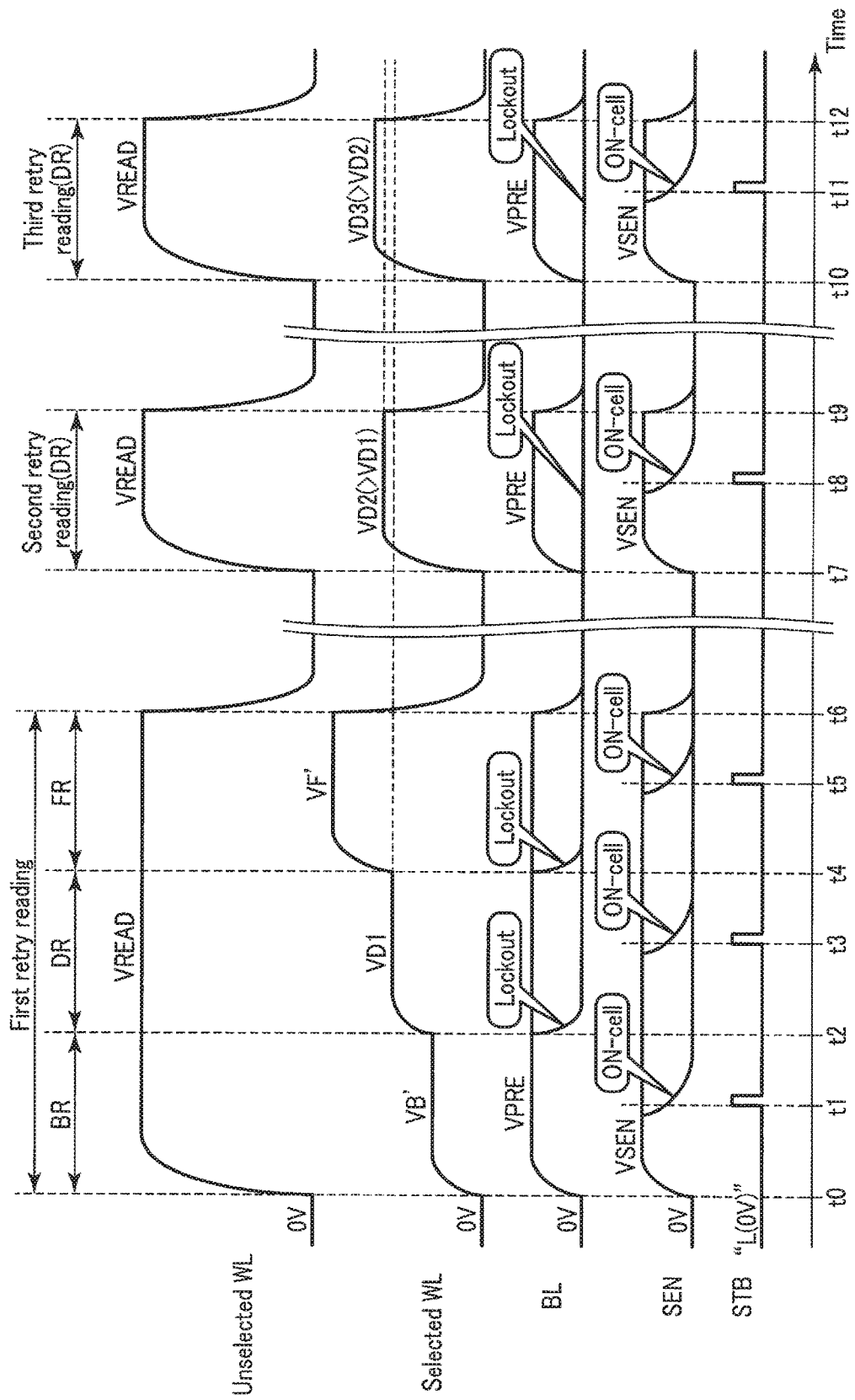

FIG. 14 shows a state of shift read tracking in a case in which the voltage VD used to determine "D" data read for the second time in the middle page is the search target.

FIG. 14 is different from FIG. 13 in that a voltage VD1 is sequentially shifted instead of the voltage VF. In addition, a strobe result of data obtained when the voltage VB' applied to the selected word line immediately before the voltage VD1 that is the search target is used is held by, for example, the latch circuit BDL as lockout information, and strobe results obtained when the voltages VB' and VF' other than the voltage VD1 are applied are held by the latch circuit ADL (more specifically, the information in the latch circuit BDL is used as the strobe result obtained by the voltage VB, and the strobe result obtained by the voltage VF is held by the latch circuit ADL. Details will be described in the second embodiment). These data items are held by the latch circuits ADL and BDL even after the end of the first retry reading (t0 to t6).

Next, the second retry reading is performed. The second retry reading is 1-level shift reading in the adaptation mode. As shown in FIG. 14, in the second retry reading, the row decoder 120 does not apply the voltages VB' and VF' as the non-search target to the selected word line, but shifts the Voltage VD as the search target from the initial value VD1 to a voltage VD2 corresponding to ΔDAC2. The column control circuit 140 locks out the bit lines BL based on the data held by the latch circuit BDL. That is, the bit lines BL corresponding to the memory cell transistors MT whose data are determined based on the strobe result at time t1 are locked out, and the remaining bit lines BL are precharged to the voltage VPRE.

In a state in which the voltage VD2 is applied to the selected word line, the signal STB is asserted, and data is strobed. After that, the column control circuit 140 generates middle page data based on the strobe result at time t8 and the data held by the latch circuit ADL (and BDL), and transmits it to the controller 200.

The third retry reading is performed in the same way. As shown in FIG. 14, the row decoder 120 does not apply the voltages VB' and VF' as the non-search target to the selected word line, but shifts the voltage VD as the search target from VD2 to a voltage VD3 corresponding to ΔDAC2. The column control circuit 140 locks out the bit lines BL based on the data held by the latch circuit BDL. That is, the bit lines BL corresponding to the memory cell transistors MT whose data are determined based on the strobe result at time t1 are locked out, and the remaining bit lines BL are precharged to the voltage VPRE.

In a state in which the voltage VD3 is applied to the selected word line, the signal STB is asserted, and data is strobed. After that, the column control circuit 140 generates middle page data based on the strobe result at time t11 and the data held by the latch circuit ADL (and BDL), and transmits it to the controller 200.

Figure 15:
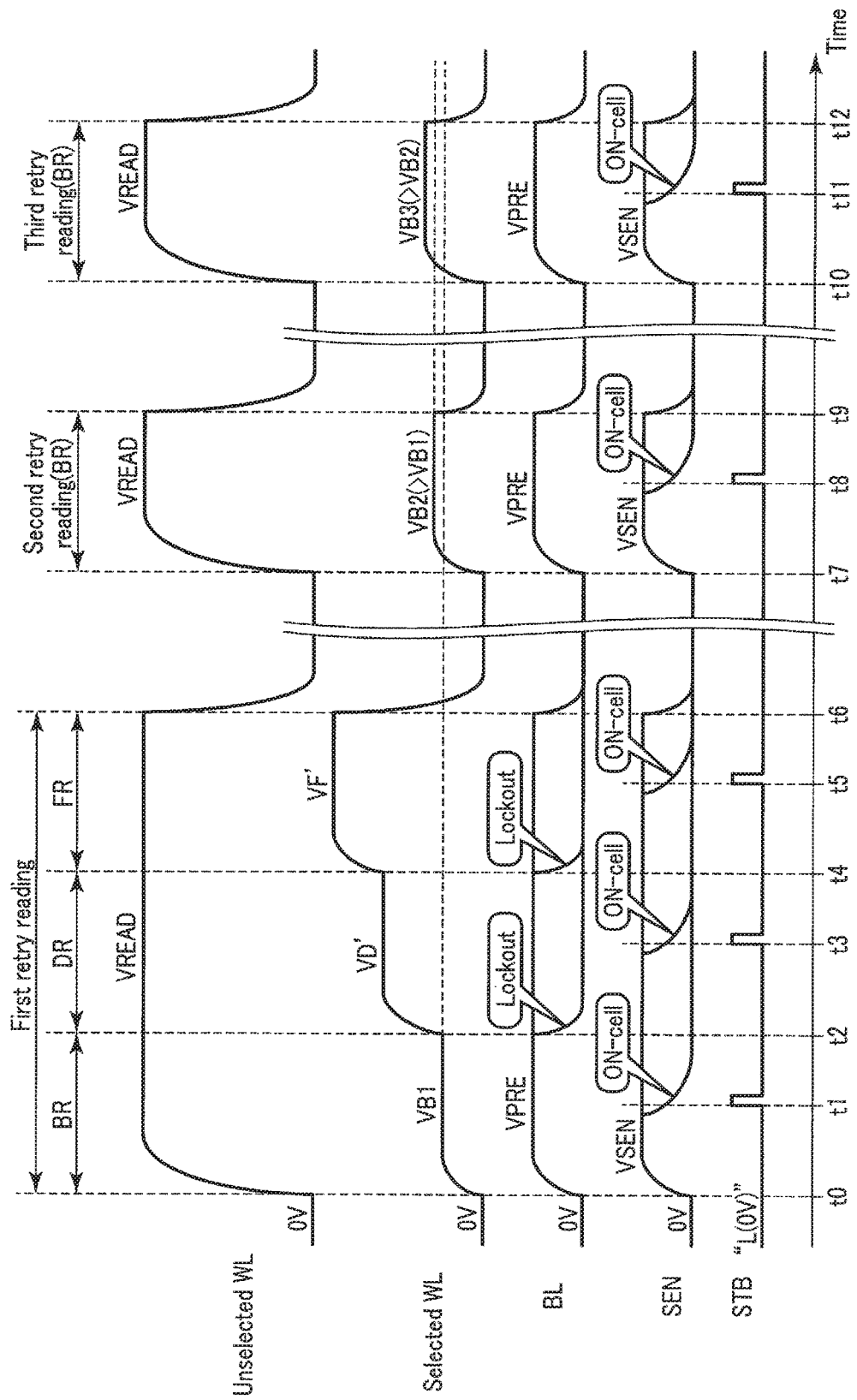

FIG. 15 shows a state of shift read tracking in a case in which the voltage VB used to determine data, that is, the "B" data read for the first time in the middle page is the search target.

In this case as well, as in FIGS. 13 and 14, the read operations BR, DR, and FR are performed in the capture mode, and not the read operations DR and FR but the read operation BR is performed in the adaptation mode. Lockout information held by the latch circuit BDL is pre-lockout information at time t0. That is, all bit lines BL are read-accessed. The latch circuit ADL holds the strobe results at times t3 and t5. In the second and subsequent retry reading, middle page data is generated using data in the latch circuit ADL.

1.3 Effects According to this Embodiment

According to this embodiment, it is possible to improve the data read accuracy. That is, according to this embodiment, in 1-level shift read tracking, normal shift reading is executed at the time of first read. From the second read, only the read voltage VCGRV corresponding to the target-level is shifted, and the result obtained by the first read is used as data corresponding to the level of non-target level. That is, data read the memory cell array is not performed for the non-level. It is therefore possible to reduce noise observed in the second and subsequent read. Hence, the error correction capability in use of 1-level shift read tracking may be improved, and the data read accuracy may be improved.

For the non-target level, a value considered to be an approximate optimal value is searched for by distribution reading. This also contributes to the improvement of the error correction capability in 1-level shift read tracking. In 1-level shift read tracking according to this embodiment, the number of on-cells is counted every time the voltage corresponding to the target level is shifted, thereby obtaining the cross point between threshold distributions corresponding to the target level. If an error cannot be corrected by 1-level shift read tracking, that is, if an error cannot be corrected by hard bit decode, soft bit decode is performed using cross point information obtained at the time of hard bit reading. This can make the most of the correction capability of the ECC circuit in soft decision.

In shift read tracking, bit lines whose data is determined are locked out. This method also applies to the normal read operation. That is, a condition, specifically, the amount of a current flowing from the bit line to the source line in the threshold distribution cross point search and that in the normal read can be almost the same (if distribution reading is used in place of shift reading, the conditions are largely different). This also contributes to the improvement of the error correction capability in 1-level shift read tracking.

As described above, even in a case in which the threshold distributions expand as described with reference to, for example, FIG. 7, the optimal read voltage may accurately be detected, and the reliability of data reading may be improved.

In 1-level shift read tracking, the read operation using the voltage corresponding to the non-target level is omitted in the second and subsequent shift reading, thereby improving the operation speed.

Note that in the above embodiment, a case in which ΔDAC and the address ADD are issued even in the second and subsequent shift reading, as in the first shift reading, has been described in FIGS. 11 and 12. However, these may be omitted. FIGS. 16 and 17 shows command sequences in this case. FIG. 16 shows 1-level shift reading in the capture mode in step S10. FIG. 17 shows 1-level shift reading in the adaptation mode repeated twice after FIG. 16.

FIGS. 16 and 17 are different from FIGS. 11 and 12 in the following points. That is, when the capture mode is selected as shown FIG. 16, the controller 200 issues the DAC (D/A converter) value corresponding to the initial value of the voltage VCGRV for the target level and the offset data ΔDAC corresponding to the shift amount of the voltage VCGRV. In addition, in the adaptation mode as shown FIG. 17, the controller 200 issues the command "XXh" and a cache read command "3Ch". If the command "3Ch" is set in the command register 160, the NAND flash memory 100 starts the data read operation from the memory cell array 110 and changes to the busy state. Data of one page is read from an area corresponding to the address transmitted from the controller 200 and held by the latch circuit XDL.

As described above, the controller 200 may first designate the initial value of the voltage VCGRV for the target level and the offset value. In this case, the voltage VCGRV is shifted from a certain initial value by a predetermined shift amount by monotone increasing or monotone decreasing. From the second retry reading (adaptation mode), the controller 200 need not issue the signals such as the address ADD, and the load on the controller may be reduced.

2. Second Embodiment

A memory system according to the second embodiment will be described next. This embodiment is directed to details of the operation of a column control circuit 140 at the time of execution of 1-level shift read tracking described in the first embodiment. Only points different from the first embodiment will be described below. Although only a middle page will be explained below, the same method is applicable to a lower page and an upper page. For the descriptive convenience, assume a case in which a memory cell array includes eight bit lines BL0 to BL7, and selected memory cells connected to the bit lines BL hold "Er", "A", "B", . . . , and "G" data, respectively.

2.1 Example in Which Target Level is Voltage VF

A case in which of the read levels used in the middle page, a voltage VF is set to the target level will be described with reference to FIGS. 18 to 26. FIGS. 18 to 26 are block diagrams showing bit lines BL and part of sense units SAU corresponding to them. This operation corresponds to FIG. 13 described in the first embodiment.

<First Retry Reading>

The first retry reading will be described first. As described in the first embodiment, in the first retry reading, all of three read operations BR, DR, and FR are executed.

Figure 18:
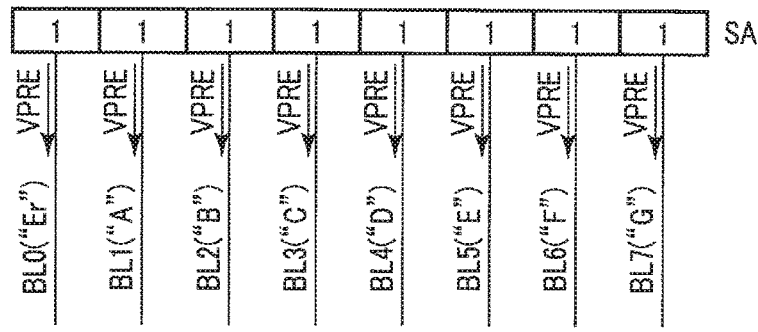
FIGS. 18 to 26 are schematic views of a sense amplifier according to the second embodiment, which illustrate data transmission/reception states at the time of execution of shift read tracking.

As shown in FIG. 18, first, to execute the read operation BR, for example, a sequencer 170 executes pre-lockout, and "1" data is set in the latch circuits of sense amplifiers SA corresponding to all the bit lines BL0 to BL7. As a result, all the bit lines BL0 to BL7 are precharged to a voltage VPRE (for example, 0.7 V).

Figure 19:
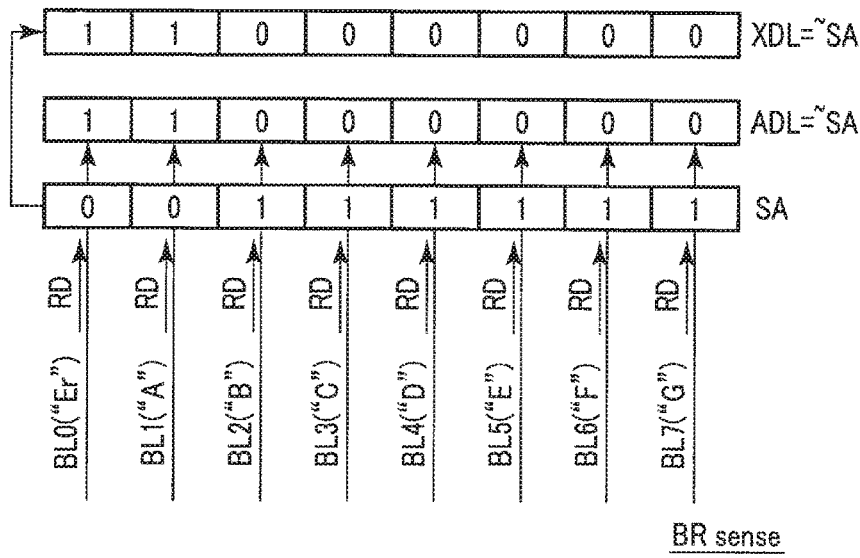

A read voltage VCGRV (=VE') is applied to a selected word line WL, and data is read to the bit lines BL. As a result, as shown in FIG. 19, a cell current flows to the bit lines BL0 and BL1 corresponding to memory cells that hold the "Er" data and the "A" data whose thresholds are smaller than that of the "B" data, and "0" data is stored in the latch circuits of the sense amplifiers SA. Additionally, in each sense unit SAU, inverted data of the data in the sense amplifier SA is transferred to latch circuits ADL and XDL. That is, the sense amplifiers SA hold 8-bit data "00111111", and the latch circuits ADL and XDL hold 8-bit data "11000000". Note that a symbol "~" in FIG. 18 represents inversion of data. The read data is held by the latch circuits ADL because they need to be used in the second and subsequent retry reading.

Figure 20:
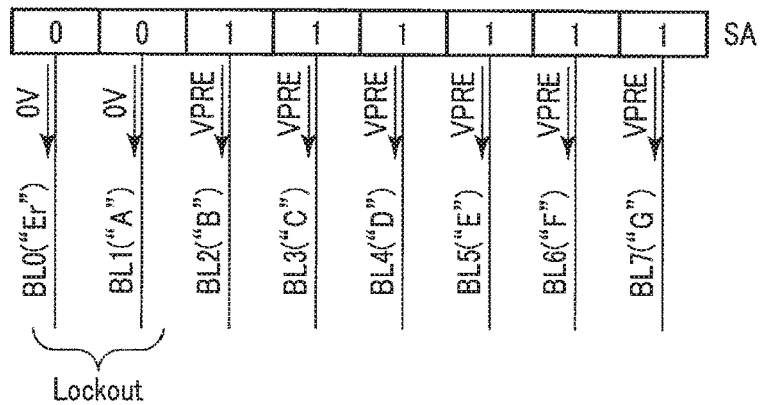

Next, the read operation DR is executed. At this time, as shown in FIG. 20, the bit lines BL are locked out based on the data held by the sense amplifiers SA. That is, in this example, the bit lines BL0 and BL1 are locked out, and their potentials are fixed to, for example, 0 V. Hence, in the read operation DR, the bit lines BL0 and BL1 are excluded from the read target. The bit lines BL2 to BL7 are set to the read target and precharged to the voltage VPRE.

Figure 21:
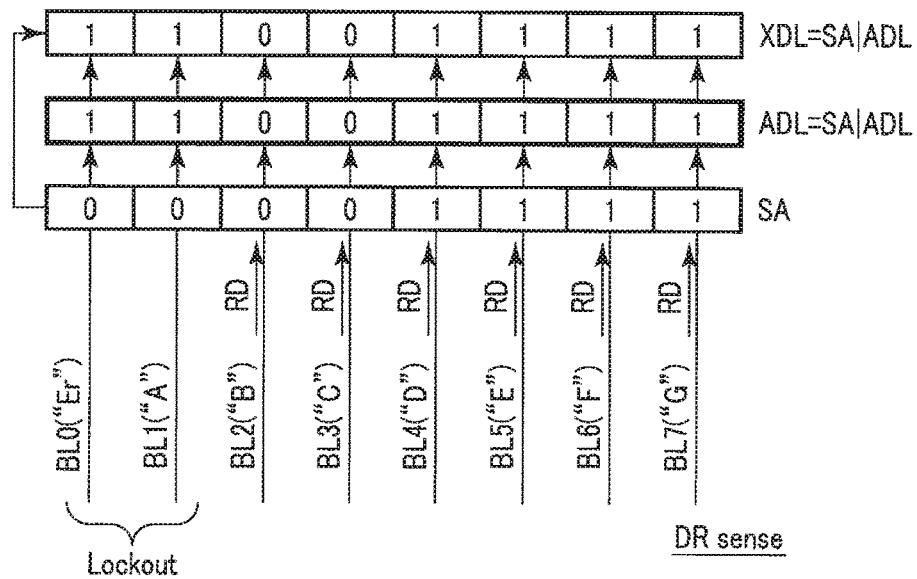

The read voltage VCGRV (=VD') is applied to the selected word line WL, and data is read to the bit lines BL. As a result, as shown in FIG. 21, a cell current flows to the bit lines BL2 and BL3 corresponding to memory cells that hold the "B" data and the "C" data whose thresholds are smaller than that of the "D" data, and "0" data is stored in the latch circuits of the sense amplifiers SA. Additionally, in each sense unit SAU, the OR operation result of the data held by the latch circuit ADL so far and the data in the sense amplifier SA is held by the latch circuit ADL, and the same data is held by the latch circuit XDL as well. This operation is performed by, for example, an operation unit OP. As a result, the sense amplifiers SA hold 8-bit data. "00001111", and the latch circuits ADL and XDL hold 8-bit data "11001111". Note that a symbol "|" in FIG. 21 represents an OR operation. At this time, the results of the read operations BR and DR are held by the latch circuits ADL, and the data is used in the second and subsequent retry reading.

Figure 22:
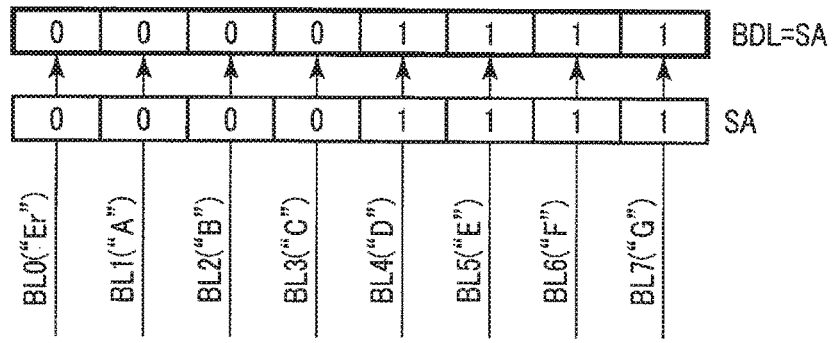

Next, as shown in FIG. 22, the data in the sense amplifiers SA is transferred to latch circuits BDL. That is, the latch circuits BDL hold 8-bit data "00001111". The data is used to decide which bit line BL should be locked out in the second and subsequent retry reading. FIG. 22 shows a state immediately before the read operation FR concerning the voltage VF as the target level is executed.

Figure 23:
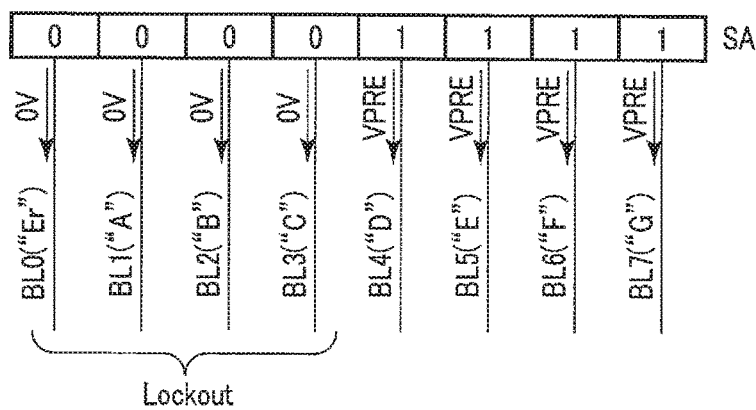

The read operation FR is executed in the state shown in FIG. 22. As in the read operation DR, the bit lines BL are locked out based on the data held by the sense amplifiers SA, as shown in FIG. 23. In this example, the bit lines BL0 to BL3 are locked out. The bit lines BL4 to BL7 are set to the read target and precharged to the voltage VPRE.

Figure 24:
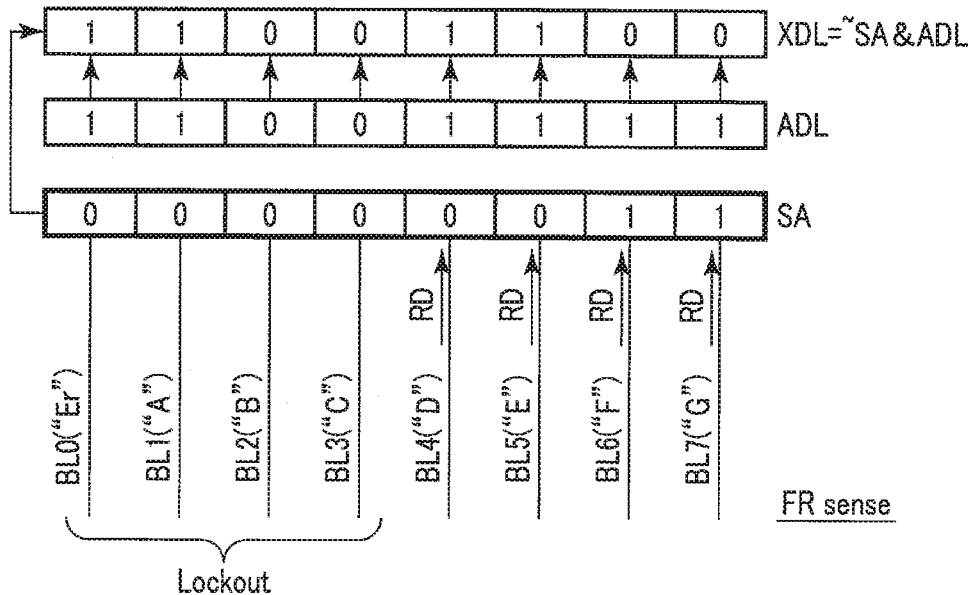

The read voltage VCGRV (=VF1) is applied to the selected word line WL, and data is read to the bit lines BL. As a result, as shown in FIG. 24, a cell current flows to the bit lines BL4 and BL5 corresponding to memory cells that hold the "D" data and the "E" data whose thresholds are smaller than that of the "F" data, and "0" data is stored in the latch circuits of the sense amplifiers SA. Additionally, in each sense unit SAU, the AND operation result of the data held by the latch circuit ADL and the inverted data of the data in the sense amplifier SA is held by the latch circuit XDL. This operation is also performed by, for example, the operation unit OP. As a result, the sense amplifiers SA hold 8-bit data "00000011", and the latch circuits XDL hold 8-bit data "11001100".

As described above, by the three read operations BR, DR, and FR, data "11001100" of one page is held by the latch circuits XDL and transmitted to a controller 200. After that, the latch circuits ADL and BDL continuously hold the set 8-bit data until a new command "XXh" is received or a clear instruction or the like is received.

<Second Retry Reading>

In the example of FIG. 24, as the result of the first retry reading, "11001100" is held by the latch circuits XDL, and the middle page is correctly read. However, if an error exists in the read result shown in FIG. 24, and the error cannot be corrected by hard decision processing, second retry reading is performed. The second retry reading will be described next. As described in the first embodiment, only the read operation FR is executed in the second retry reading.

Figure 25:
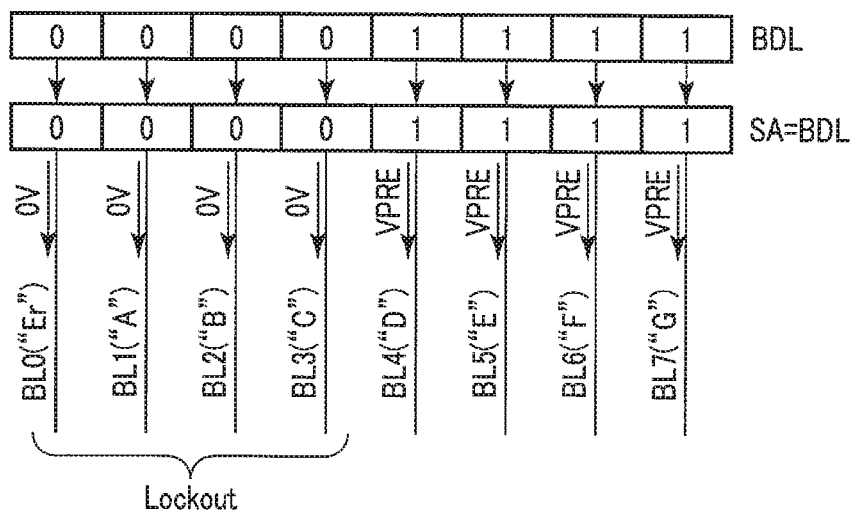
Figure 26:
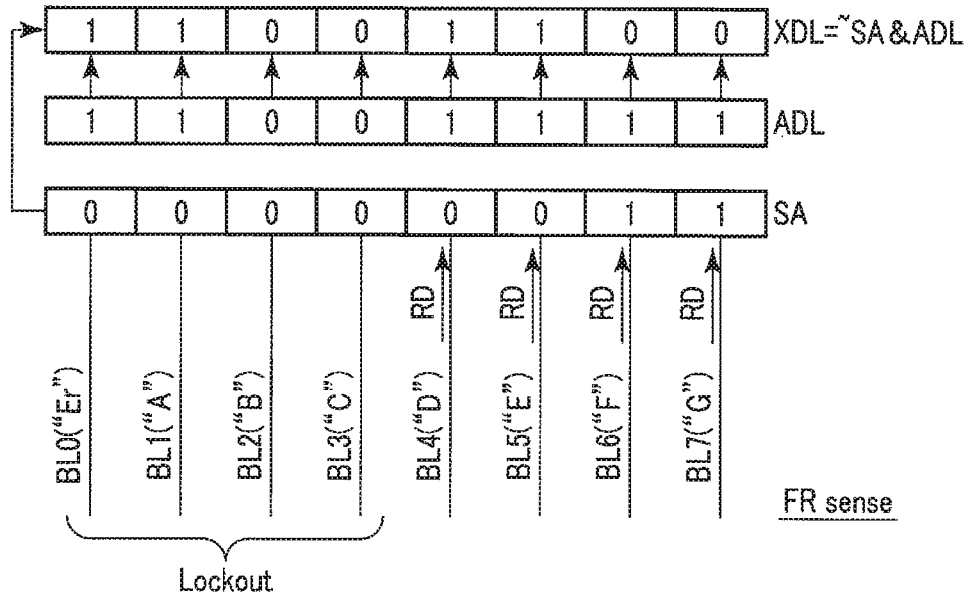

When performing the read operation FR, the sequencer 170 transfers the data "00001111" held by the latch circuits BDL to the sense amplifiers SA, as shown in FIG. 25. That is, the bit lines BL to be locked out are decided based on the data in the latch circuits BDL. In this example, the bit lines BL0 to BL3 are locked out. The bit lines BL4 to BL7 are set to the read target and precharged to the voltage VPRE.

The read voltage VCGRV (=VF2) is applied to the selected word line WL, and data is read to the bit lines BL. As a result, shown in FIG. 26, a cell current flows to the bit lines BL4 and BL5 corresponding to memory cell that hold the "D" data and the "E" data, and "0" data is stored in the latch circuits of the sense amplifiers SA. Additionally, in each sense unit SAU, the AND operation result of the inverted data of the data in the sense amplifier SA and the data in the latch circuit ADL is stored in the latch circuit XDL. As a result, the latch circuits XDL hold 8-bit data "11001100".

As described above, using the data in the latch circuits ADL, the data "11001100" of one page can be obtained only by performing the read operation FR. This data is transmitted to the controller 200. The third or subsequent retry reading is the same as the second retry reading except that the read voltage VCGRV applied to the selected word line WL is further shifted.

<State of 1-Level Shift Read Tracking>

Figure 27:
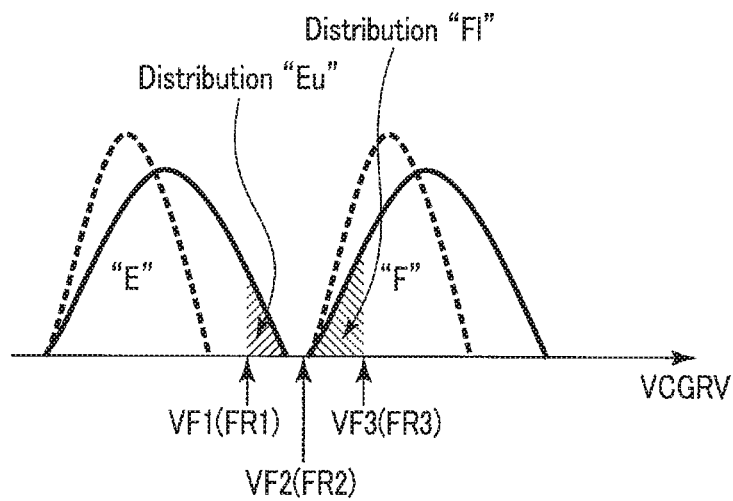
FIG. 27 is a graph showing the threshold distributions of a memory cell.

The operation shown in FIGS. 18 to 26 will be described using a more detailed example. FIG. 27 shows the threshold distributions of the "E" state and the "F" state. A broken line indicates a threshold distribution immediately after writing. A case in which the threshold distribution changes to a distribution indicated by a solid line is assumed. As the read voltages, the voltages VF1 (read operation FR1), VF2 (read operation FR2), and VF3 (read operation FR3) are applied. At this time, the voltage VF1 is smaller than the maximum value of the threshold distribution of the "E" state. The state from the voltage VF1 to the maximum value of the threshold distribution of the "E" state will be referred to as a state "Eu". In addition, the voltage VF3 is larger than the minimum value of the threshold distribution of the "F" state. The state from the minimum value of the threshold distribution of the "F" state to the voltage VF3 will be referred to as a state "F1". The voltage VF2 almost equals the minimum value of the state "F".

In this example, the states of the latch circuits obtained when the voltage VCGRV is shifted from VF1 to VF2 and then to VF3 by performing retry reading three times will be described with reference to FIGS. 28 to 30. In this example, the threshold of a memory cell corresponding to the bit line BL6 has the state "Eu", the threshold of a memory cell corresponding to the bit line BL7 has the state "F1", and the threshold of a memory cell corresponding to the bit line BL8 has the state "F". A description will be made below with focus on the three bit lines BL6 to BL8.

Figure 28:
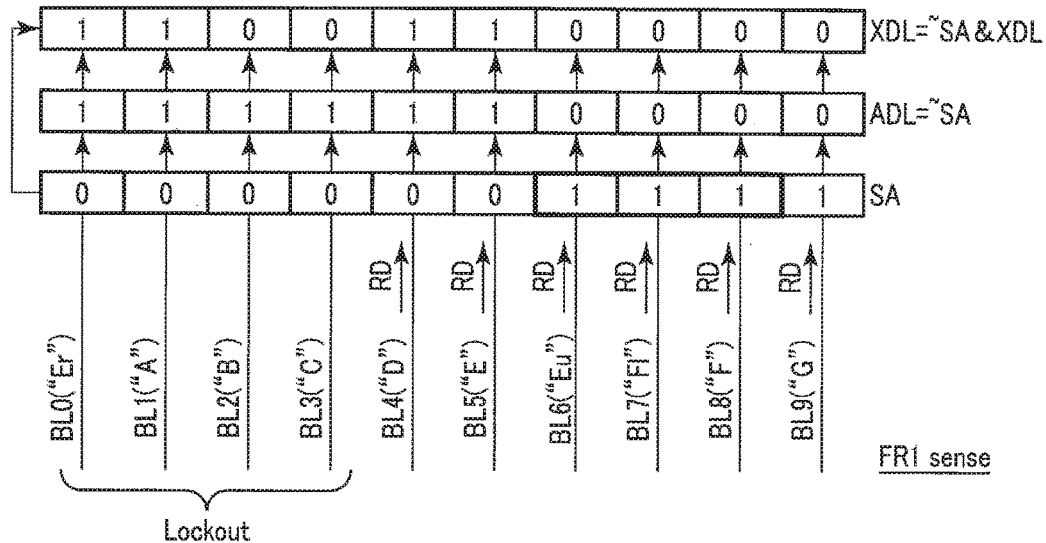
FIGS. 28 to 40 are schematic views of the sense amplifier according to the second embodiment, which illustrate data transmission/reception states at the time of execution of shift read tracking.

As shown in FIG. 28, in the first retry reading, VF1 is applied as the voltage VCGRV to the selected word line WL.

Then, as shown in FIG. 28, no cell current flows to the bit line BL6, and "1" data is held by the latch circuits of the sense amplifiers SA corresponding to the bit lines BL6 to BL8. Data held by the three bit lines BL6 to BL8 are "111". A read error occurs in the memory cell corresponding to the bit line BL6.

Figure 29:
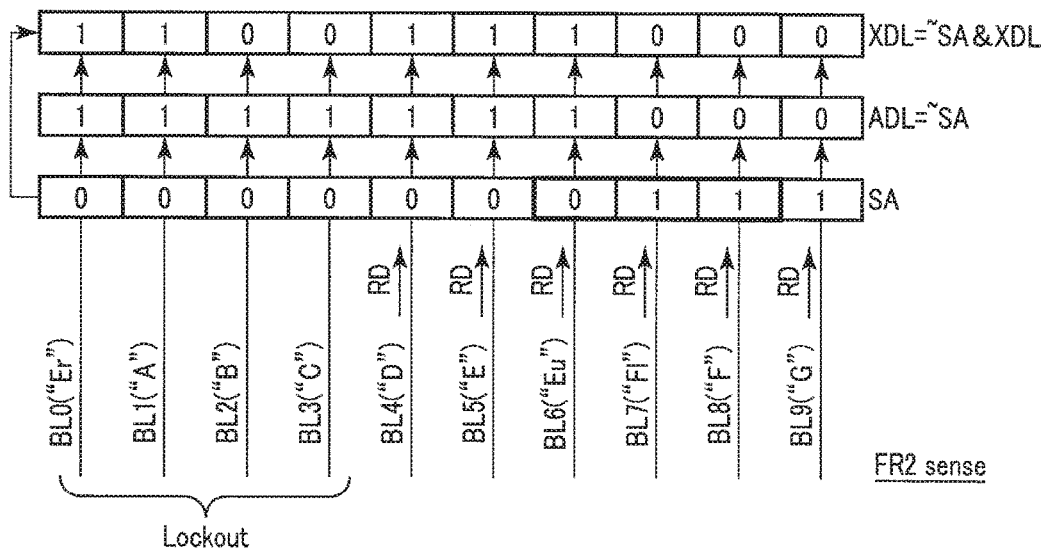
Figure 30:
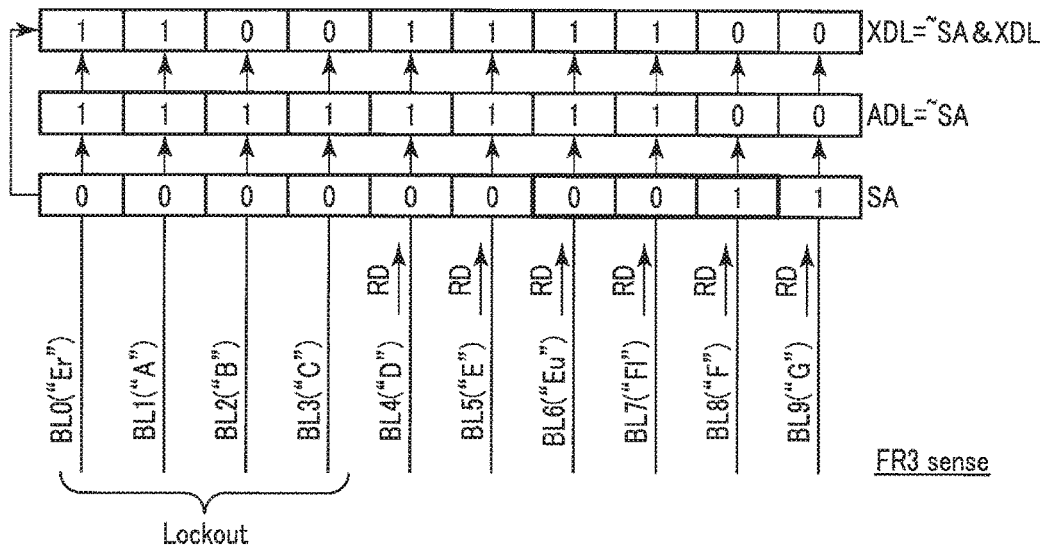

Next, as shown in FIG. 29, in the second retry reading, VF2 is applied as the voltage VCGRV to the selected word line WL. Then, a cell current flows to the bit line BL6 but not to the bit lines BL7 and BL8. As a result, "0" data is held by the latch circuit of the sense amplifier SA corresponding to the bit line BL6. Data held by the three bit lines BL6 to BL8 are "011".

In the example shown in FIG. 29, the read data does not include an error. However, if many errors occur in the bit lines BL (not shown), and the errors cannot be corrected by hard decision processing, the third retry reading is performed, as shown in FIG. 30. If VF3 is applied as the voltage VCGRV to the selected word line WL, a cell current flows to the bit lines BL6 and BL7 but not to the bit line BL8. As a result, "0" data is held by the latch circuits of the sense amplifiers SA corresponding to the bit lines BL6 and BL7. Data held by the three bit lines BL6 to BL8 are "001".

As described above, when the voltage VCGRV corresponding to the target level VF is shifted, the number of errors included in the read data changes. The controller 200 counts the number of on-cells while shifting the voltage VCGRV. This makes it possible to find a voltage corresponding to the cross point between the threshold distributions of the "E" state and the "F" state (in other words, the trough between the two threshold distributions).

If the number of errors can be made to fail within a correctable range by shifting the voltage VCGRV, the data can be decoded by hard bit decoding (YES in step S16). On the other hand, if the number of errors cannot be made to fall within a correctable range, it is difficult to decode the data by hard bit decoding. However, even if correction by hard bit decoding is impossible, a read voltage considered to be approximately correct can be detected by counting the number of on-cells while shifting the voltage VCGRV. When the detected voltage is used, it is possible to make the most of the correction capability of the ECC circuit in soft decision processing of step S20.

2.2 Example in Which Target Level is Voltage VD

A case in which of the read levels used in the middle page, a voltage VD is set to the target level will be described next with reference to FIGS. 31 to 35. FIGS. 31 to 35 are block diagrams showing the bit lines BL and part of the sense units SAU corresponding to them. This operation corresponds to FIG. 14 described in the first embodiment.

<First Retry Reading>

The first retry reading will be described first. As described in the section 2.2, in the first retry reading, all of the three read operations BR, DR, and FR are executed.

Figure 31:
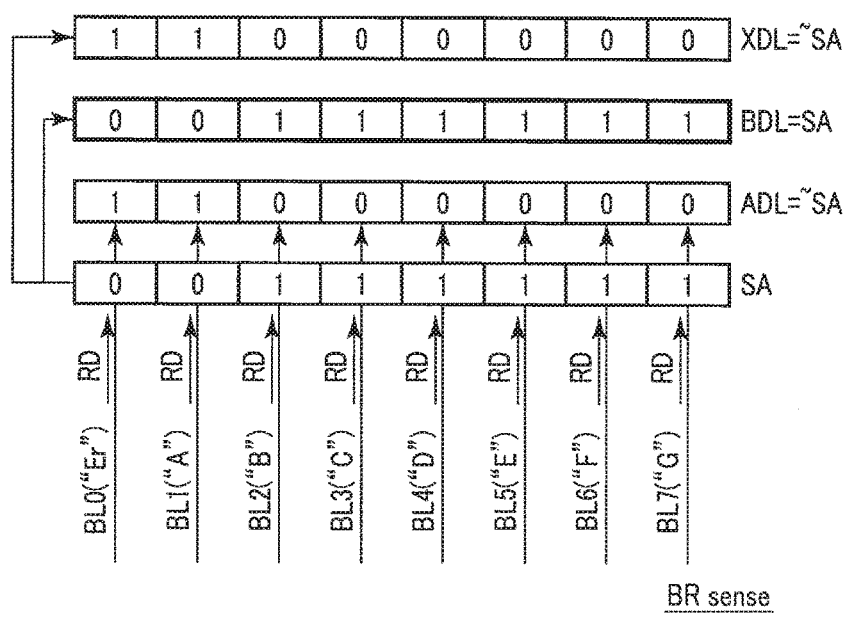

That is, as shown in FIG. 18, the sequencer 170 executes pre-lockout, and all the bit lines BL0 to BL7 are precharged to the voltage VPRE. The read voltage VCGRV (=VB') is applied to the selected word line WL, and data is read to the bit lines BL. As a result, as shown in FIG. 31, a cell current flows to the bit lines BL0 and BL1, and "0" data is stored in the latch circuits of the sense amplifiers SA. Additionally, in each sense unit SAU, inverted data of the data in the sense amplifier SA is transferred to the latch circuits ADL and XDL. Furthermore, the data in the sense amplifier SA is transferred to the latch circuit BDL.

That is, the sense amplifiers SA hold 8-bit data "00111111", the latch circuits ADL and XDL hold 8-bit data "11000000", and the latch circuits EDL hold 8-bit data "00111111". The data in the latch circuits BDL is used to decide which bit line BL should be locked out in the second and subsequent retry reading and also used to generate data of one page.

Figure 32:
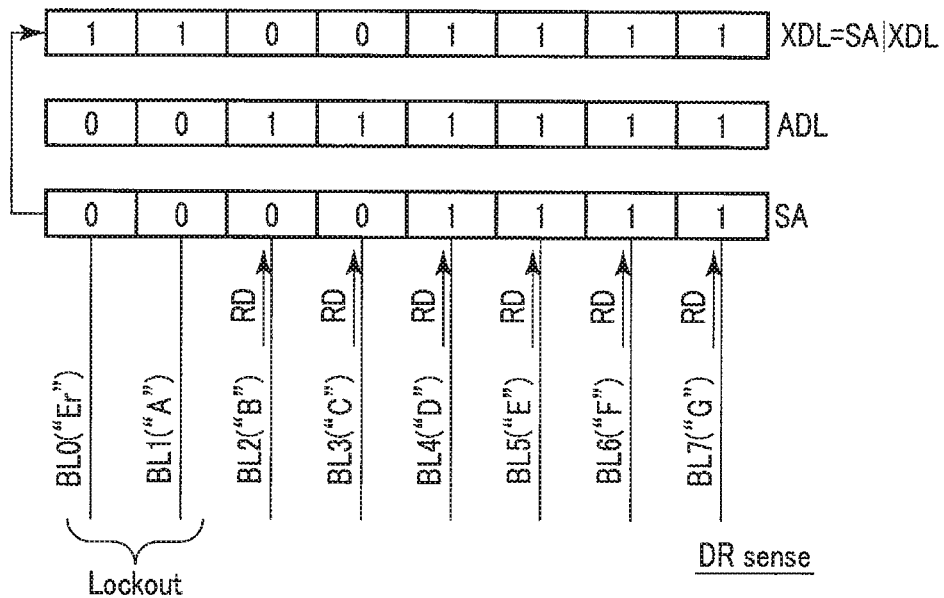

Next, the read operation DR is executed. At this time, as shown in FIG. 20, the bit lines BL0 and BL1 are locked out, and the bit lines BL2 to BL7 are set to the read target and precharged to the voltage VPRE. The read voltage VCGRV (=VD1) is applied to the selected word line WL, and data is read to the bit lines BL. As a result, as shown in FIG. 32, a cell current flows to the bit lines BL2 and BL3, and "0" data is stored in the latch circuits of the sense amplifiers SA. Additionally, in each sense unit SAU, the OR operation result of the data held by the latch circuit XDL so far and the data in the sense amplifier SA is held by the latch circuit XDL. As a result, the sense amplifiers SA hold 8-bit data "00001111", and the latch circuits XDL hold 8-bit data "11001111".

Figure 33:
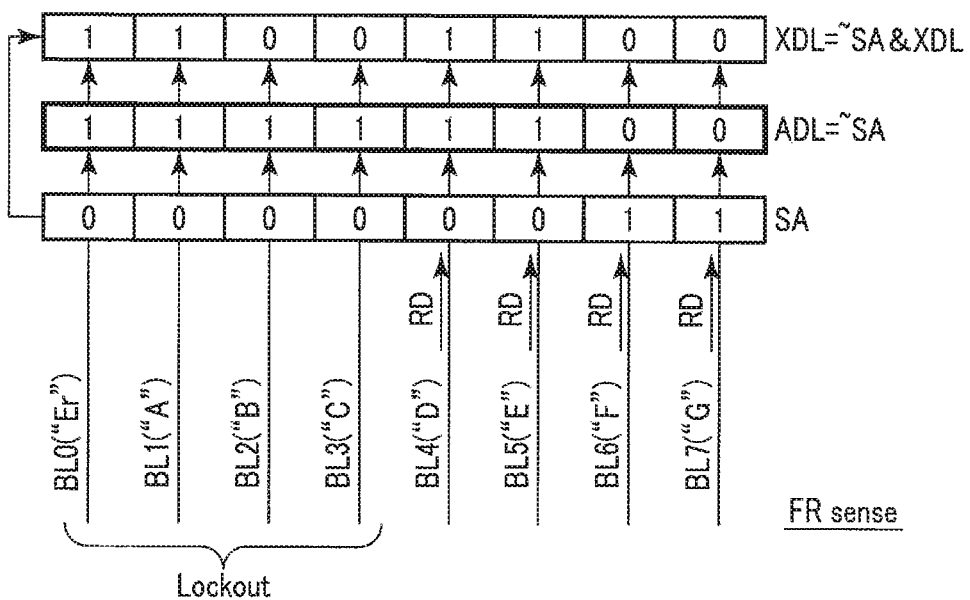

Next, the read operation FR is executed. At this time, as shown in FIG. 23, the bit lines BL0 to BL3 are locked out, and the bit lines BL4 to BL7 are set to the read target and precharged to the voltage VPRE. The read voltage VCGRV (=VF') is applied to the selected word line WL, and data is read to the bit lines BL. As a result, as shown in FIG. 33, a cell current flows to the bit lines BL4 and BL5, and "0" data is stored in the latch circuits of the sense amplifiers SA. Additionally, in each sense unit SAU, inverted data of the data in the sense amplifier SA is held by the latch circuit ADL, and the AND operation result of the data held by the latch circuit XDL and the inverted data of the data in the sense amplifier SA is held by the latch circuit XDL. As a result, the sense amplifiers SA hold 8-bit data "00000011", the latch circuits ADL hold 8-bit data "11111100", and the latch circuits XDL hold 8-bit data "11001100". The latch circuits BDL (not shown) hold 8-bit data "00111111". The data in the latch circuits ADL is used to generate data of one page in the second and subsequent retry reading together with the data in the latch circuits BDL.

As described above, by the three read operations BR, DR, and FR, data "11001100" of one page are held by the latch circuits XDL and transmitted to the controller 200. After that, the latch circuits ADL and BDL continuously hold the set 8-bit data until the new command "XXh" is received or a clear instruction or the like is received.

<Second Retry Reading>

In the example of FIG. 33, as the result of the first retry reading, "11001100" are held by the latch circuits XDL, and the middle page is correctly read, as in the example of FIG. 24. However, if an error exists in the read result shown in FIG. 33, and the error cannot be corrected by hard decision processing, second retry reading is performed. The second retry reading will be described below. In the second retry reading, only the read operation DR is executed.

Figure 34:
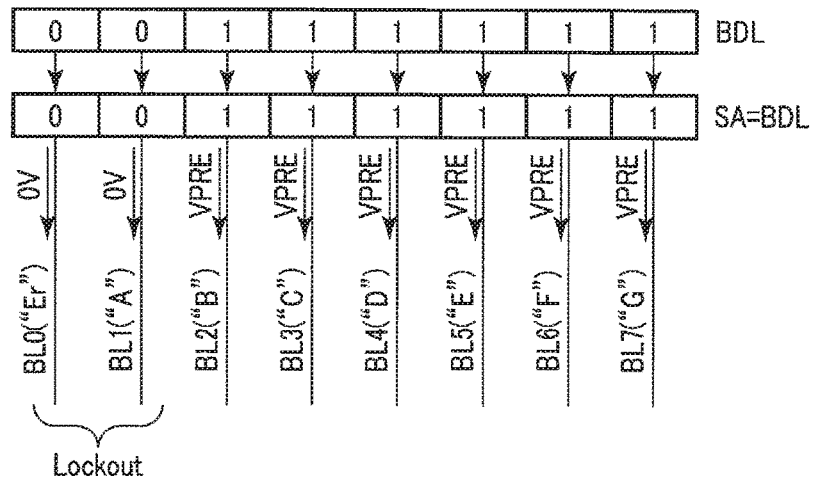

When performing the read operation DR, the sequencer 170 transfers the data "00111111" held by the latch circuits BDL to the sense amplifiers SA, as shown in FIG. 34. That is, the bit lines BL to be locked out are decided based on the data in the latch circuits BDL. In this example, the bit lines BL0 and BL1 are locked out.

Figure 35:
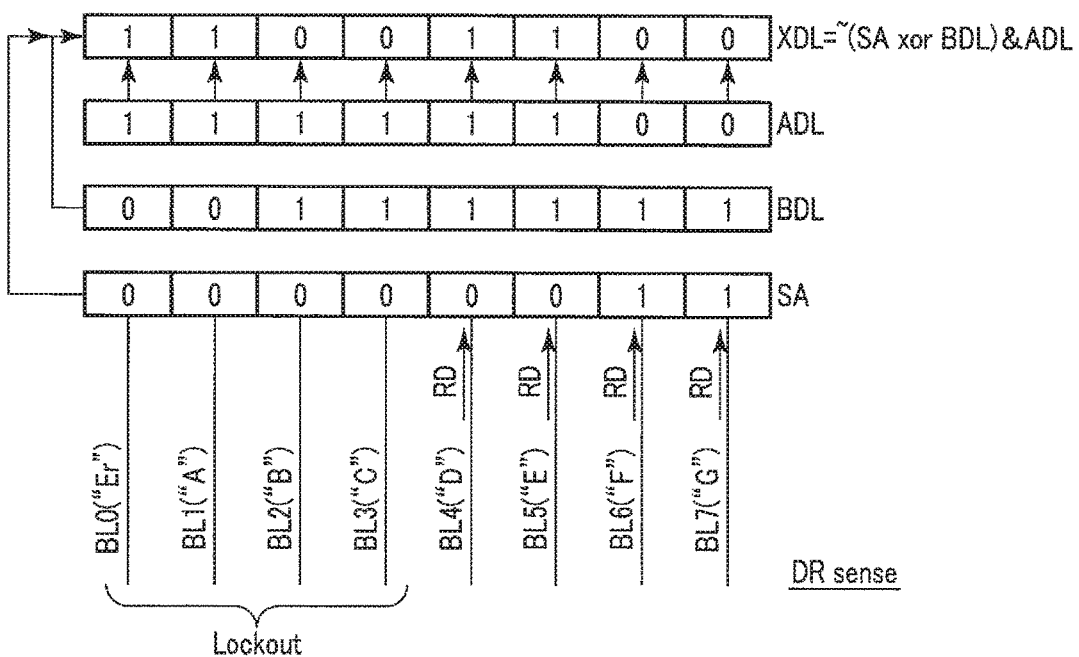

The read voltage VCGRV (=VD2) is applied to the selected word line WL, and data is read to the bit lines BL. As a result, as shown in FIG. 35, a cell current flows to the bit lines BL4 and BL5, and "0" data is stored in the latch circuits of the sense amplifiers SA. Additionally, in each sense unit SAU, the XOR operation between the data in the sense amplifier SA and the data in the latch circuit BDL is performed. Furthermore, the AND operation between inverted data of the operation result and the data in the latch circuit ADL is performed. This is held by the latch circuit XDL as data of one page.

As described above, using the data in the latch circuits ADL and BDL, the data "11001100" of one page can be obtained only by performing the read operation DR.

2.3 Example in Which Target Level is Voltage VB

A case in which of the read levels used in the middle page, a voltage VB is set to the search target will be described next with reference to FIGS. 36 to 40. FIGS. 36 to 40 are block diagrams showing the bit lines BL and part of the sense units SAU corresponding to them. This operation corresponds to FIG. 15 described in the first embodiment.

<First Retry Reading>

The first retry reading will be described first. As described above, in the first retry reading, all of the three read operations BR, DR, and FR are executed.

Figure 36:
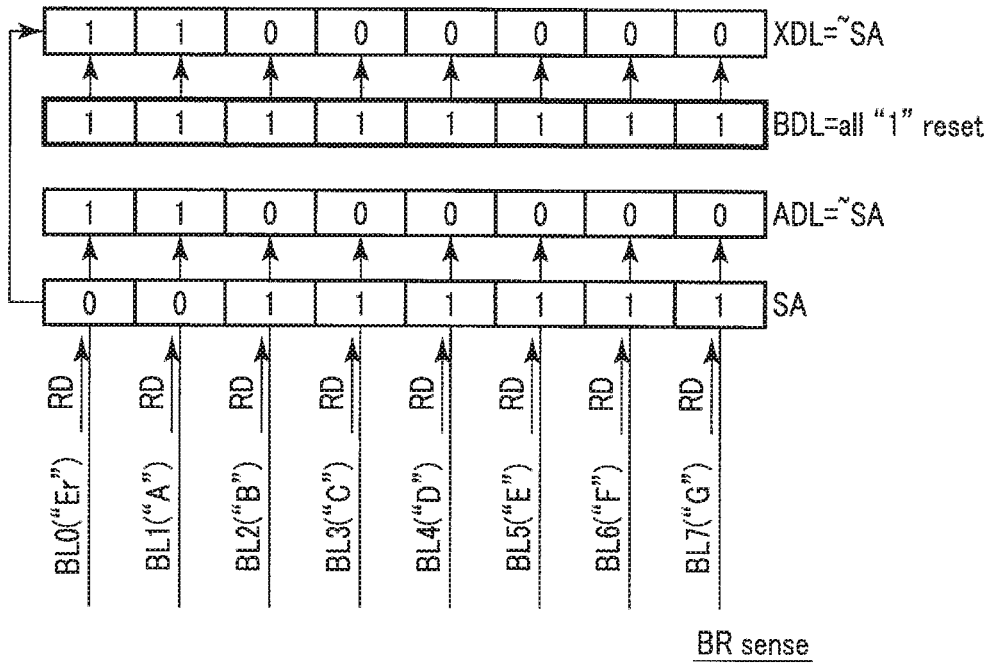

That is, as shown in FIG. 18, the sequencer 170 executes pre-lockout, and all the bit lines BL0 to BL7 are precharged to the voltage VPRE. The read voltage VCGRV (=VB1) is applied to the selected word line WL, and data is read to the bit lines BL. As a result, as shown in FIG. 36, a cell current flows to the bit lines BL0 and BL1, and "0" data is stored in the latch circuits of the sense amplifiers SA. Additionally, in each sense unit SAU, inverted data of the data in the sense amplifier SA is transferred to the latch circuits ADL and XDL. Furthermore, in the latch circuits BDL, all bits are reset, and "1" data is set.

That is, the sense amplifiers SA hold 8-bit data "00111111", the latch circuits ADL and XDL hold 8-bit data "11000000", and the latch circuits BDL hold 8-bit data "11111111". The data in the latch circuits BDL are used to decide which bit line BL should be locked out in the second and subsequent retry reading.

Figure 37:
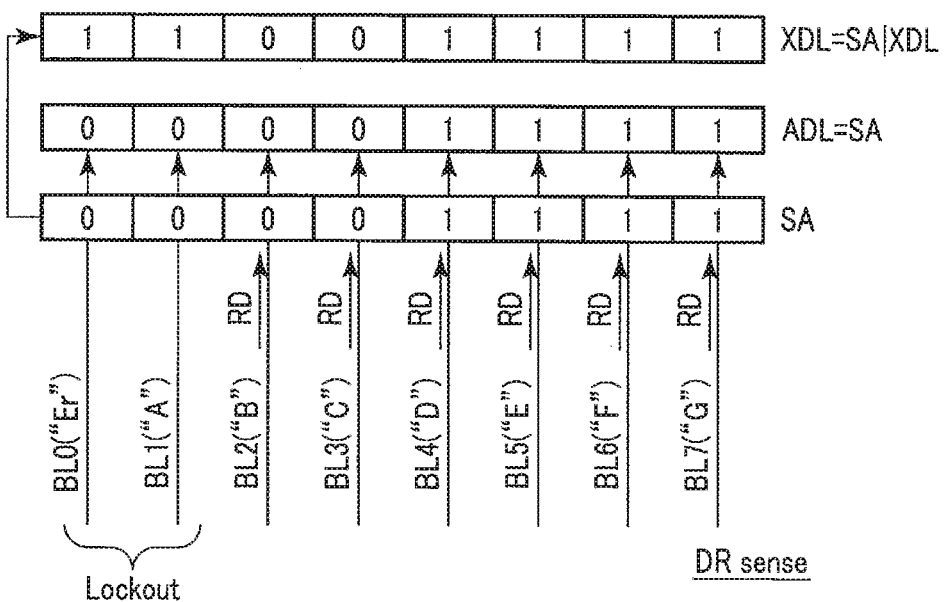

Next, the read operation DR is executed. At this time, as shown in FIG. 20, the bit lines BL0 and BL1 are locked out, and the bit lines BL2 to BL7 are set to the read target and precharged to the voltage VPRE. The read voltage VCGRV (=VD') is applied to the selected word line WL, and data is read to the bit lines BL. As a result, as shown in FIG. 37, a cell current flows to the bit lines BL2 and BL3, and "0" data is stored in the latch circuits of the sense amplifiers SA. Additionally, in each sense unit SAU, the data in the sense amplifier SA is transferred to the latch circuit ADL, and the OR operation result of the data held by the latch circuit XDL so far and the data in the sense amplifier SA is held by the latch circuit XDL. As a result, the sense amplifiers SA and the latch circuits ADL hold 8-bit data "00001111", and the latch circuits XDL hold 8-bit data "11001111".

Figure 38:
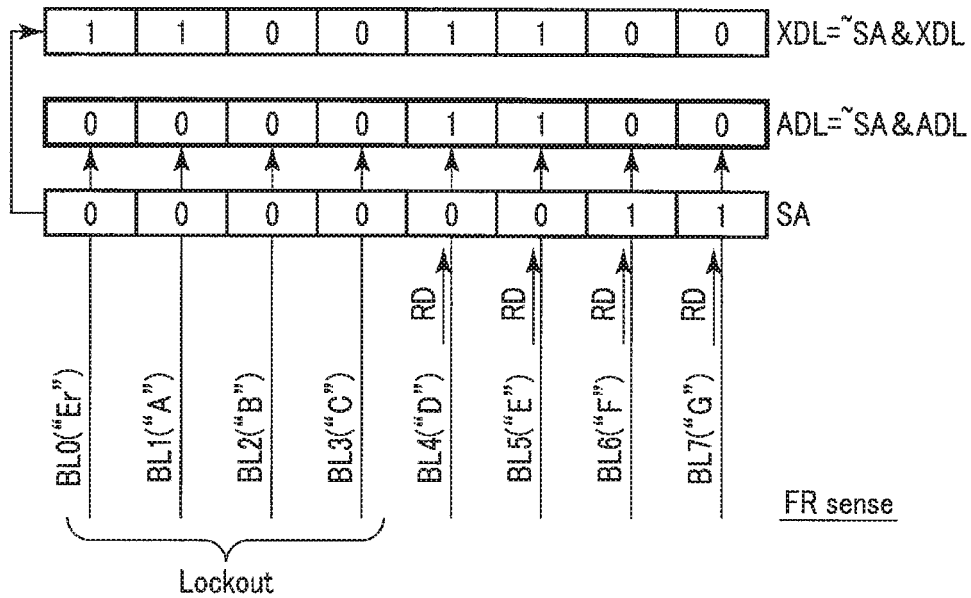

Next, the read operation FR is executed. At this time, as shown in FIG. 23, the bit lines BL0 to BL3 are locked out, and the bit lines BL4 to BL7 are set to the read target and precharged to the voltage VPRE. The read voltage VCGRV (=VP') is applied to the selected word line WL, and data is read to the bit lines BL. As a result, as shown in FIG. 38, a cell current flows to the bit lines BL4 and BL5, and "0" data is stored in the latch circuits of the sense amplifiers SA. Additionally, in each sense unit SAU, the AND operation result of the data held by the latch circuit ADL so far and inverted data of the data in the sense amplifier SA is held by the latch circuit ADL. Furthermore, the AND operation result of the data held by the latch circuit XDL so far and the inverted data of the data in the sense amplifier SA is held by the latch circuit XDL. As a result, the sense amplifiers SA hold 8-bit data "00000011", the latch circuits ADL hold 8-bit data "00001100", and the latch circuits XDL hold 8-bit data "11001100". The latch circuits BDL (not shown) hold 8-bit data "11111111". The data in the latch circuits ADL is used to generate data of one page in the second and subsequent retry reading.

As described above, by the three read operations BR, DR, and FR, data "11001100" of one page is held by the latch circuits XDL and transmitted to the controller 200. After that, the latch circuits ADL and BDL continuously hold the set 8-bit data until the new command "XXh" is received or a clear instruction or the like is received.

<Second Retry Reading>

In the example of FIG. 38, the result of the first retry reading, "11001100" is held by the latch circuits XDL, and the middle page is correctly read, as in the example of FIG. 24. However, if an error exists in the read result shown in FIG. 38, and the error cannot be corrected by hard decision processing, second retry reading is performed. The second retry reading will be described below. In the second retry reading, only the read operation BR is executed.

Figure 39:
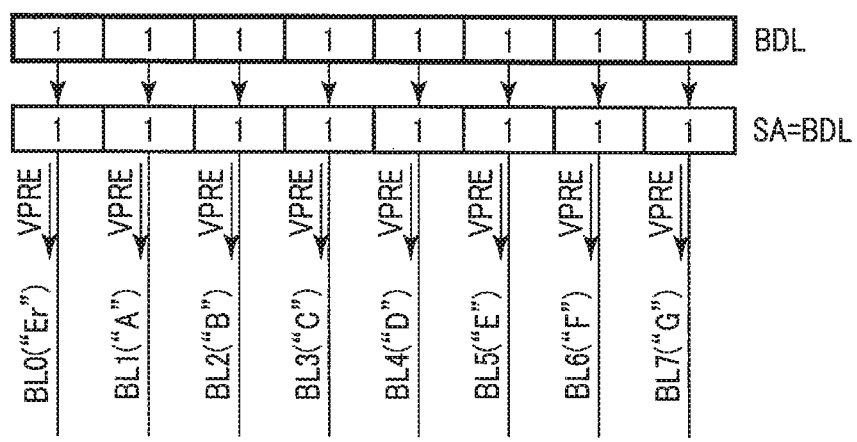

When performing the read operation BR, the sequencer 170 transfers the data "11111111" held by the latch circuits BDL to the sense amplifiers SA, as shown in FIG. 39. That is, the bit lines BL to be locked out are decided based on the data in the latch circuits BDL. In this example, all the bit lines BL0 to BL7 are set to the read target and precharged to the voltage VPRE.

Figure 40:
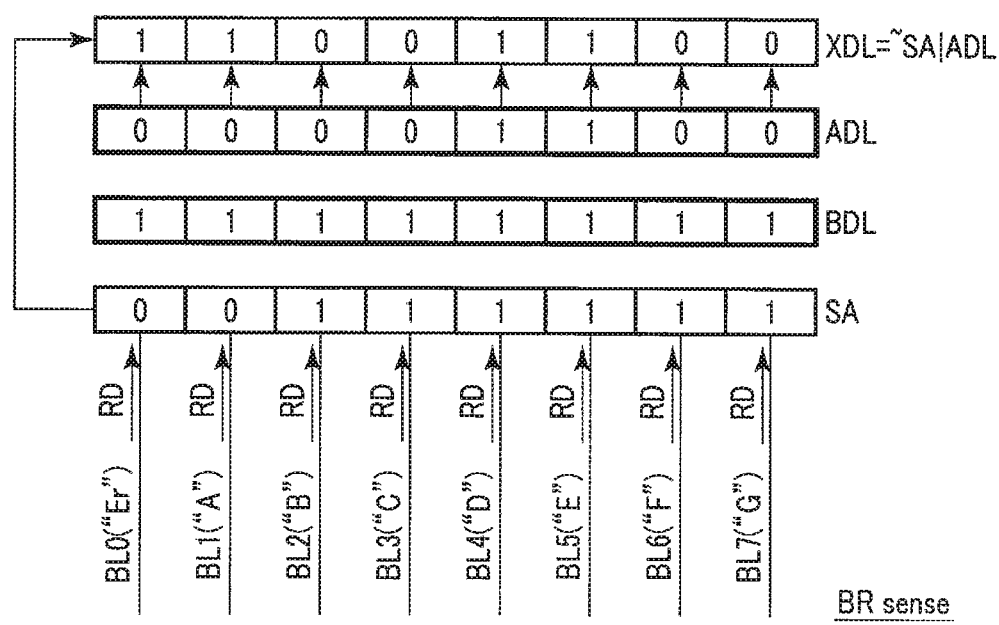

The read voltage VCGRV (=VB2) is applied to the selected word line WL, and data is read to the bit lines BL. As a result, as shown in FIG. 40, a cell current flows to the bit lines BL0 and BL1, and "0" data is stored in the latch circuits of the sense amplifiers SA. Additionally, in each sense unit SAU, the OR operation between the inverted data in the sense amplifier SA and the data in the latch circuit ADL is performed, and the operation result is held by the latch circuits XDL as data of one page.

As described above, using the data in the latch circuits ADL and BDL, the data "11001100" of one page can be obtained only by performing the read operation DR.

2.4 Effects According to this Embodiment

The method described in the first embodiment may be implemented by, for example, the method described in this embodiment. That is, when lockout data obtained by the first retry reading and the strobe results for the non-target levels are held in the latch circuits and used, data strobe for the non-target levels is not needed in the second retry reading.

3. Third Embodiment

A memory system according to the third embodiment will be described next. This embodiment is directed to a case in which lower page data is read in the first and second embodiments.

3.1 Overall Procedure of Retry Reading

Figure 41:
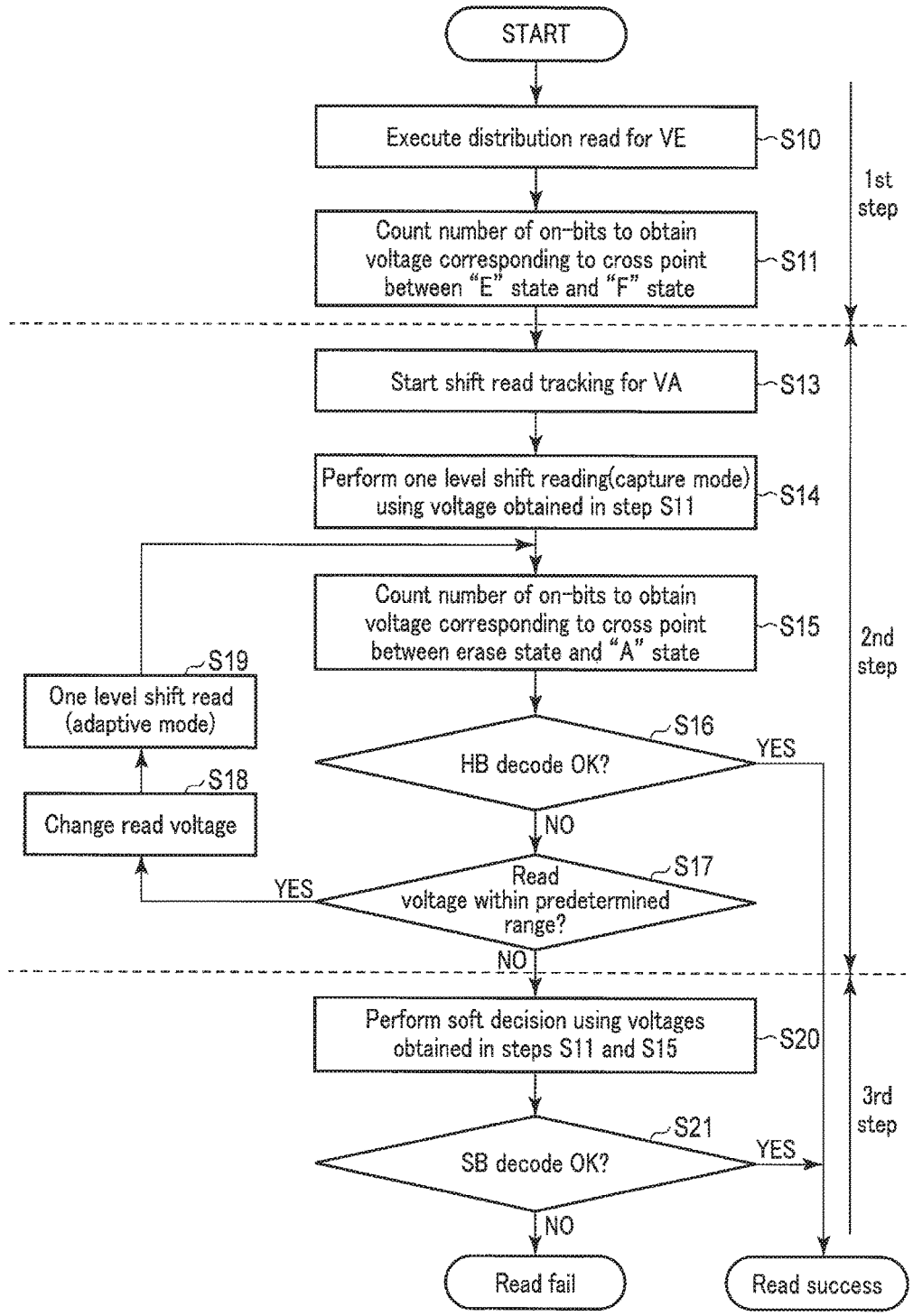
FIG. 41 is a flowchart of shift read tracking according to the third embodiment.

In FIG. 41, FIG. 8 described in the first embodiment is applied to lower page data reading. As described with reference to FIG. 5, lower page data is read using VA which is the minimum read levels of eight read levels VA to GR and VE. The read level VA is set to the target level.

Hence, distribution reading is executed first for the read level VE (step S10). A processor 230 of a controller 200 searches for a voltage (DAC value) corresponding to the cross point between the "D" state and the "E" state based on the result of distribution reading (step S11). The found voltage corresponding to the cross point will be referred to as VE' hereinafter.

Figure 42:
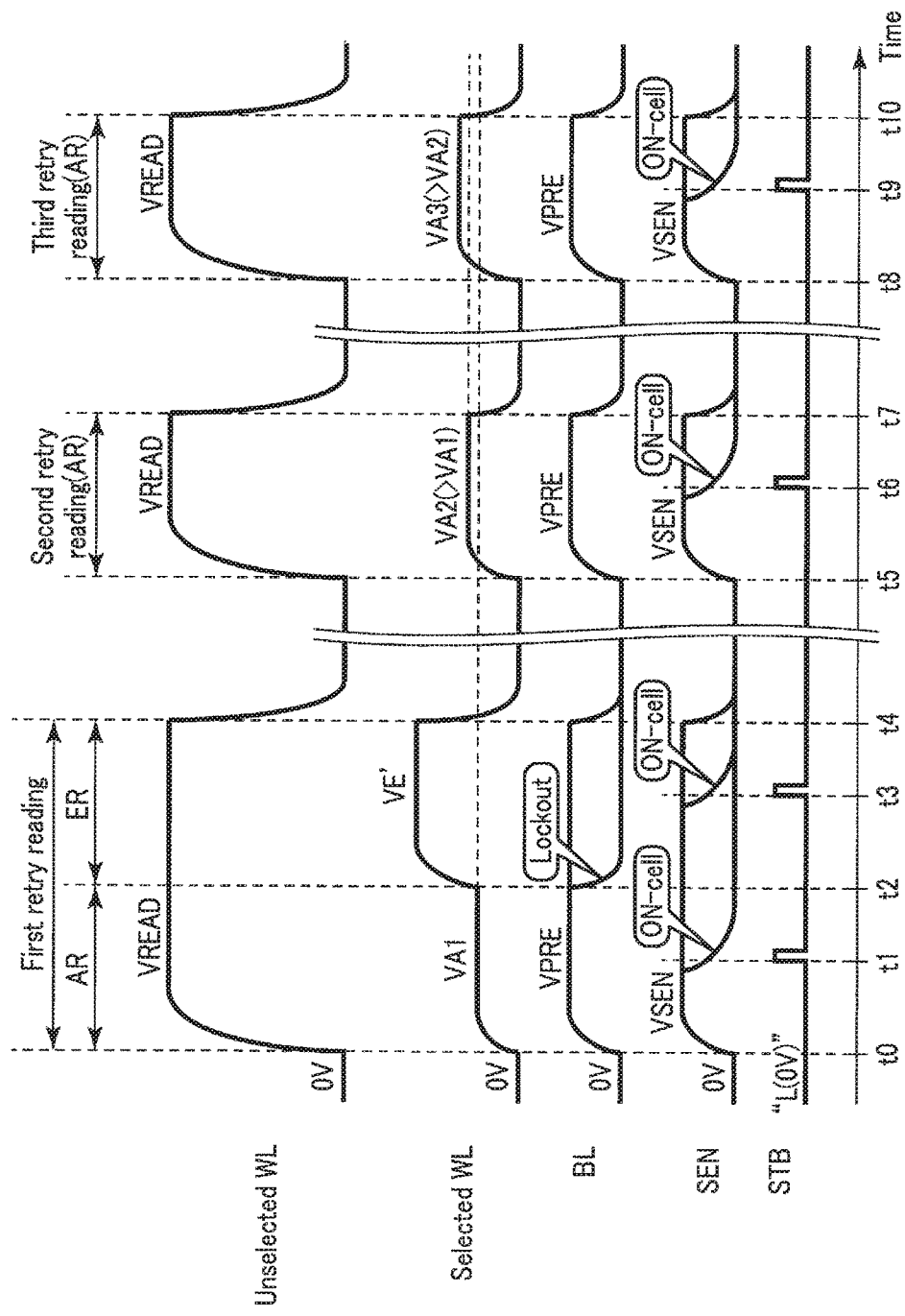
FIG. 42 is a timing chart of various signals at the time of execution of shift read tracking according to the third embodiment.

Next, the controller 200 starts 1-level shift read tracking (step S13). FIG. 42 is a timing chart of various signals at the time of execution of 1-level shift read tracking.

First, the controller 200 instructs a NAND flash memory 100 to execute 1-level shift read tracking in the capture mode (step S13). That is, a read operation AR is executed using a voltage VA1 based on initial value information given by the controller 200, and next, a read operation ER is executed using the voltage VE' found in step S11 (step S14). If hard bit decoding fails in the first retry reading (NO in step S16), the voltage VA corresponding to the target level is shifted from VA1 to VA2, and 1-level shift read tracking in the adaptation mode is executed (steps S18 and S19).

The 1-level shift read tracking in the adaptation mode is repeated while shifting value of VA until hard bit decoding succeeds (YES in step S16) or the value of the read voltage VA reaches the maximum value (or minimum value) of a predetermined range (NO in step S17).

If the hard bit decoding does not succeed for the read voltage VA within the predetermined range, soft decision processing is performed.

In this example as well, even if correction by hard bit decoding is impossible, the value of the read voltage VA considered to be approximately correct may be detected by counting the number of on-cells while shifting a voltage VCGRV, and the value may be used in soft decision.

3.2 Effects According to this Embodiment

When reading data using a read level corresponding to the cross point between a threshold distribution corresponding to the erase state and an adjacent threshold distribution, as in this embodiment, this read level is preferably set to the target level. This point will be described with reference to FIG. 43. FIG. 43 is a graph of threshold distributions, which shows a state in which the threshold distributions vary due to various factors.

As shown in FIG. 43, the shapes of the threshold distributions corresponding to the "A" to "F" states are almost equal to each other. For example, place focus on the "D" state and the "E" state. The shapes of the threshold distributions of these states are almost bilaterally symmetric with respect to the cross point. Hence, for the read levels VB to VF, the voltage corresponding to the cross point between the threshold distributions obtained by distribution reading is the almost optimal read voltage as the read voltage VCGRV.

To the contrary, as for the threshold distribution corresponding to the erase state ("Er"), the upper tail readily shifts to the high voltage side. In the example of FIG. 43, the voltage considerably rises to the higher voltage side of the "A" state. Hence, if focus is placed on the erase state and the "A" state, the shapes of the threshold distributions are greatly different from the shapes bilaterally symmetric with respect to the cross point. For this reason, the cross point between the threshold distributions of the two states does not always correspond to the optimal read voltage.

As described above, since it is difficult to obtain the optimal read voltage for the read level VA, the target level is preferably set to VA in lower page reading including the read operation AR. That is, the optimal value of VE is first obtained by distribution reading. As for the optimal value (decodable value) of VA, the ECC circuit attempts correction while shifting the value of VA. As a result, if the correction succeeds, the value is eventually suitable as the read voltage. Whether the value is the optimal value is unknown, as a matter of course. However, correcting data suffices, and the optimal value need not be used.

The above-described procedure may be applied to the "G" state. That is, the lower tail of the threshold distribution of the "G" state readily shifts to the low voltage side, as shown in FIG. 43. Hence, in page reading including the read operation GR, the target level may be set to VG.

4. Fourth Embodiment

A memory system according to the fourth embodiment will be described next. In this embodiment, not only a read voltage for a target level but also a read voltage for a non-target level is obtained using 1-level shift read tracking in the first to third embodiments. Only points different from the first to third embodiments will be described below.

4.1 Read Operation

First Example

Figure 44:
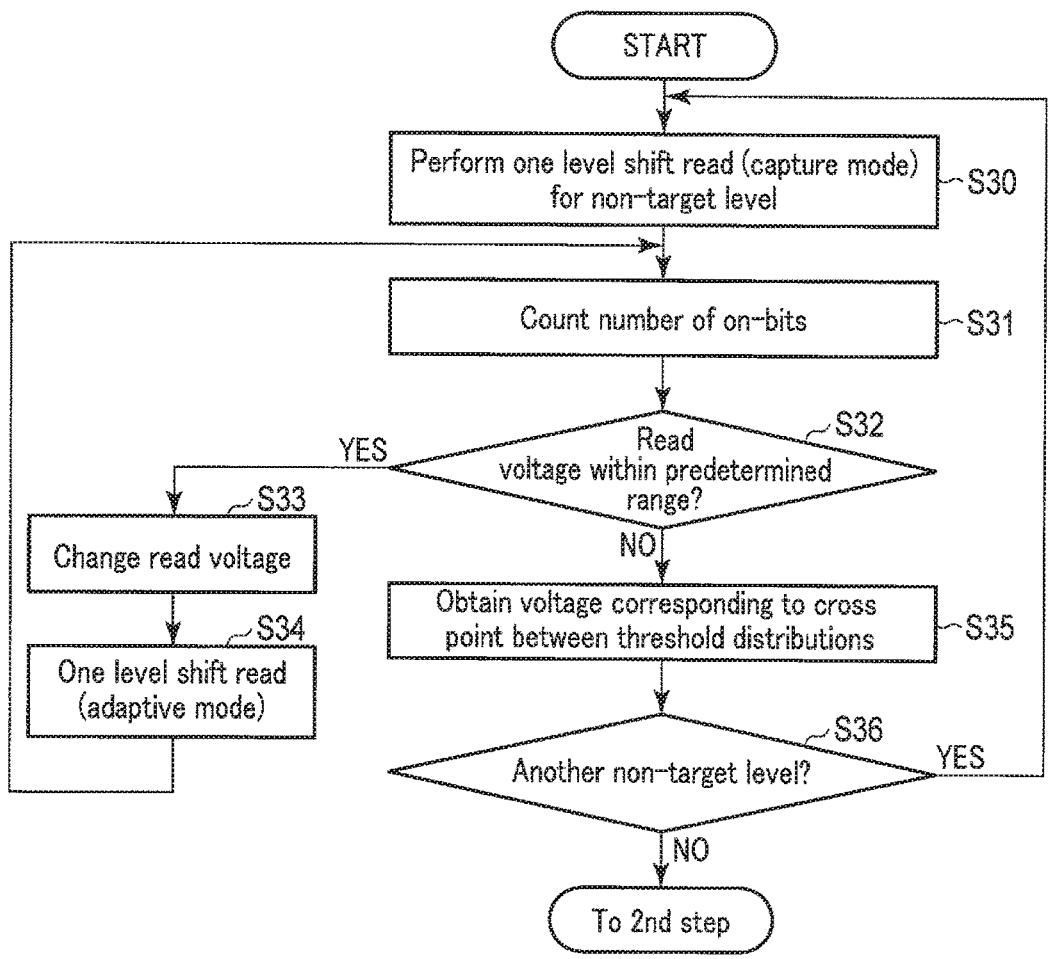
FIGS. 44 and 45 are flowcharts of a data read operation according to the fourth embodiment.

FIG. 44 is a flowchart showing a data read operation according to the first example of this embodiment, and corresponds to the first step (steps S10 to S12) in FIG. 8 described in the embodiment and FIG. 41 described in the second embodiment. A case in which middle page data is read, in the second step, a read level VF is set to the target level, and read levels VB and VD are set to the non-target levels will be described below as an example.

As shown in FIG. 44, in a NAND flash memory 100, 1-level shift reading in the capture mode is executed for one of the non-target levels (VB in this example) in accordance with an instruction from a controller 200 (step S30), and data of one page is transmitted from the NAND flash memory 100 to the controller 200. In step S30, VB that is the non-target level is shifted by a value designated by the controller 200. For the other non-target level VD and the target level VF, for example, the same values as in normal read are used.

Then, for example, a processor 230 counts the number of on-bits in the read operation using non-target level VB based on the received data of one page (step S31). At this time, the controller 200 only counts the number of on-bits, and detection and correction of an error are not performed. Hence, an ECC circuit 260 may be turned off.

If a read voltage VCGRV has a value within a predetermined range in shift reading (YES in step S32), the processor 230 instruct the NAND flash memory 100 to change the shift amount of the read voltage VCGRV corresponding to the non-target level VB (step S33), and executes 1-level shift reading again (step S34). The 1-level shift reading executed in step S34 is 1-level shift reading in the adaptation mode. That is, in step S34, the read operation is executed only for the non-target level VB, but the read operation is not performed for the remaining read levels VD and VF. Additionally, unlike the first embodiment, data (data in latch circuits ADL described in the second embodiment) concerning the remaining read levels VD and VF, which are obtained in step S30, are not used. However, lockout information (data in latch circuits BDL described in the second embodiment) obtained in step S30 is used, and bit lines BL corresponding to memory cells that are already ON are excluded from the read target.

In the described above, the 1-level shift reading in the adaptation mode is repeated for the non-target level VB until the read voltage VCGRV reaches the maximum value in the predetermined range (steps S33 and S34). If the read voltage VCGRV reaches the maximum value in the predetermined range (YES in step S32), the processor 230 obtains a voltage corresponding to the cross point between the threshold distributions (the cross point between the threshold distributions of the "A" state and the "B" state) based on the number of on-bits recorded for each voltage VCGRV shifted a plurality of times in step S31 (step S35). The method of obtaining the voltage corresponding to the cross point is the same as that described with reference to, for example, FIGS. 9 and 10. If another non-target level exists (YES in step S36), the process returns to step S30 to perform the same operation. That is, the same operation as described above is repeated for the non-target level VD.

If another non-target level does not exist (NO in step S36), the process proceeds to the second step described in the first embodiment. The operation of the second step is the same as described in the first to third embodiments. However, as the read voltage VCGRV corresponding to the non-target levels VB and VD used in the capture mode, the value found in step S35 is used. Additionally, since error correction of the read data is performed in the second step, the ECC circuit is turned on.

Second Example

Figure 45:
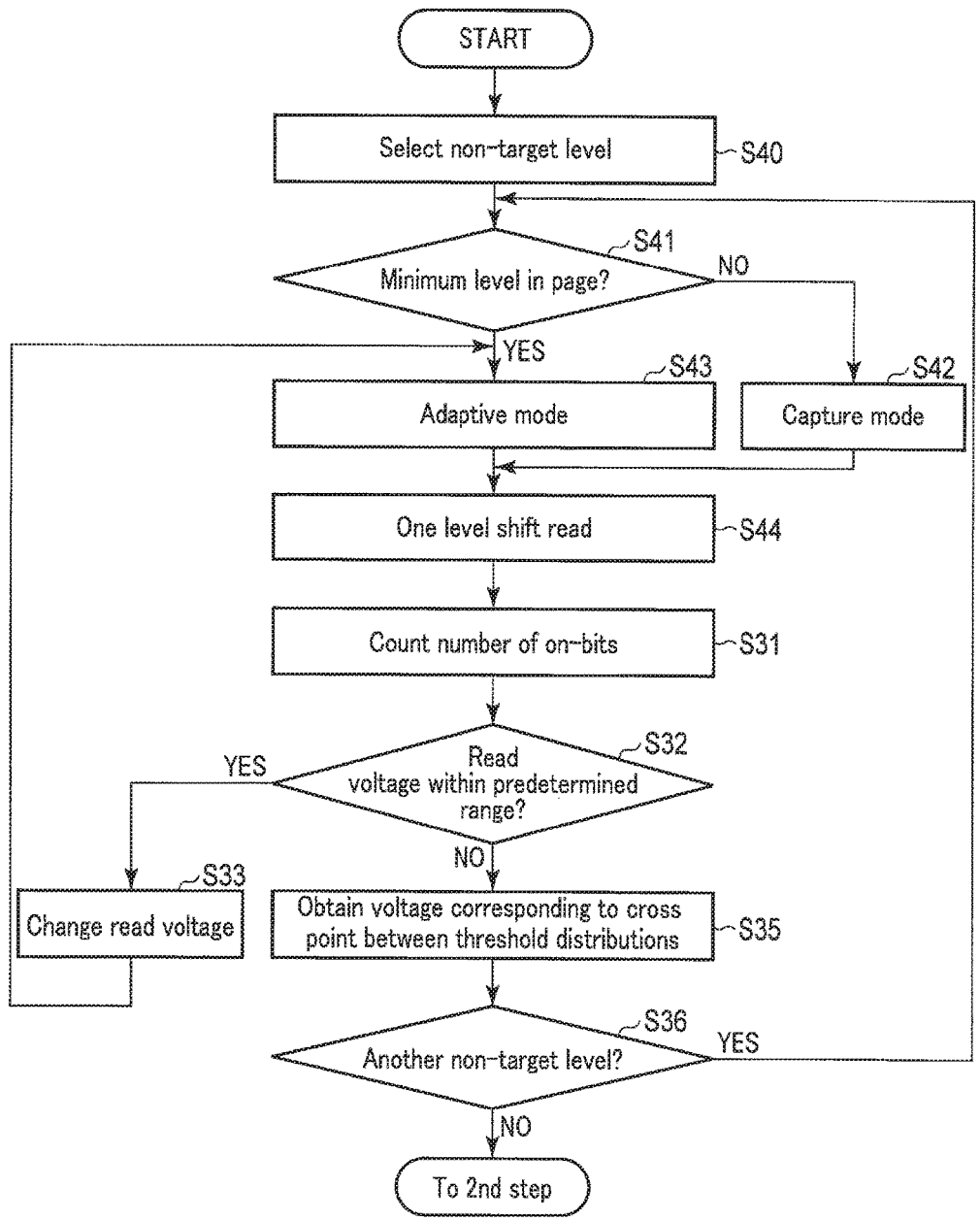

The second example will be described next with reference to FIG. 45. FIG. 45 is a flowchart showing a data read operation according to the second example of this embodiment, and corresponds to the first step (steps S10 to S12) in FIG. 8 described in the first embodiment and FIG. 41 described in the second embodiment, like FIG. 44.

As shown in FIG. 45, this example is different from FIG. 44 in that the capture mode and the adaptation mode are selectively used depending on whether the non-target level, which is treated as the search target in the first step, is the minimum level of the plurality of read levels used to determine page data.

That is, if the non-target level is not the minimum read level (NO in step S41), that is, if the search target is the read level VD in the example described in the first example, the controller 200 performs 1-level shift reading in the capture mode first (steps S42 and S44) and, after that, performs 1-level shift reading in the adaptation mode (steps S33, S43, and S44). The processing procedure in this case is the same as in the first example.

On the other hand, if the non-target level is the minimum read level (YES in step S41), that is, if the search target is the read level VB in the example described in the first example, the controller 200 performs 1-level shift reading in the adaptation mode from the first retry reading without performing 1-level shift reading in the capture mode (steps S43 and S44).

4.2 Effects According to this Embodiment

As described in this embodiment, as the method of obtaining the optimal voltage of the non-target level, not only distribution reading but also shift reading may be used. Even if shift reading is used, obtaining the optimal voltage of the non-target level is equivalent to obtaining the cross point between threshold distributions, and therefore, the ECC circuit may be off.

As described in the first embodiment, in the shift reading, the read operation is performed under almost the same condition as in normal read. Hence, as compared to a case in which distribution reading is used, a more accurate optimal voltage may be obtained.

A case in which if the non-target level that is the search target in the first step is the minimum level of the plurality of read levels used to determine page data, the capture mode reading is not performed has been described above as the second example. The capture mode is unnecessary because if the search target is the minimum level, all bit lines BL are included in the read target.

On the other hand, if the target level is not the minimum level, it is preferable to perform the capture mode in advance to obtain the information of a bit line to be locked out. Needless to say, even if the target level is not the minimum level, the capture mode can be omitted. In this case, however, all bit lines BL are included in the read target, and the degree of potential variation of the source line is different from that in the normal read operation in which some of the bit lines BL are locked out. Hence, to accurately obtain the read voltage corresponding to the non-target level, the capture mode is preferably executed.

5. Fifth Embodiment

A memory system according to the fifth embodiment will be described next. In this embodiment, not the number of on-bits but the number of error bits is counted based on a check matrix obtained at the time of decoding by an ECC circuit 260, and an, optimal read voltage for a target level is decided in accordance with the count in the first to fourth embodiments. Only points different from the first to fourth embodiments will be described below.

5.1 Retry Reading

Figure 46:
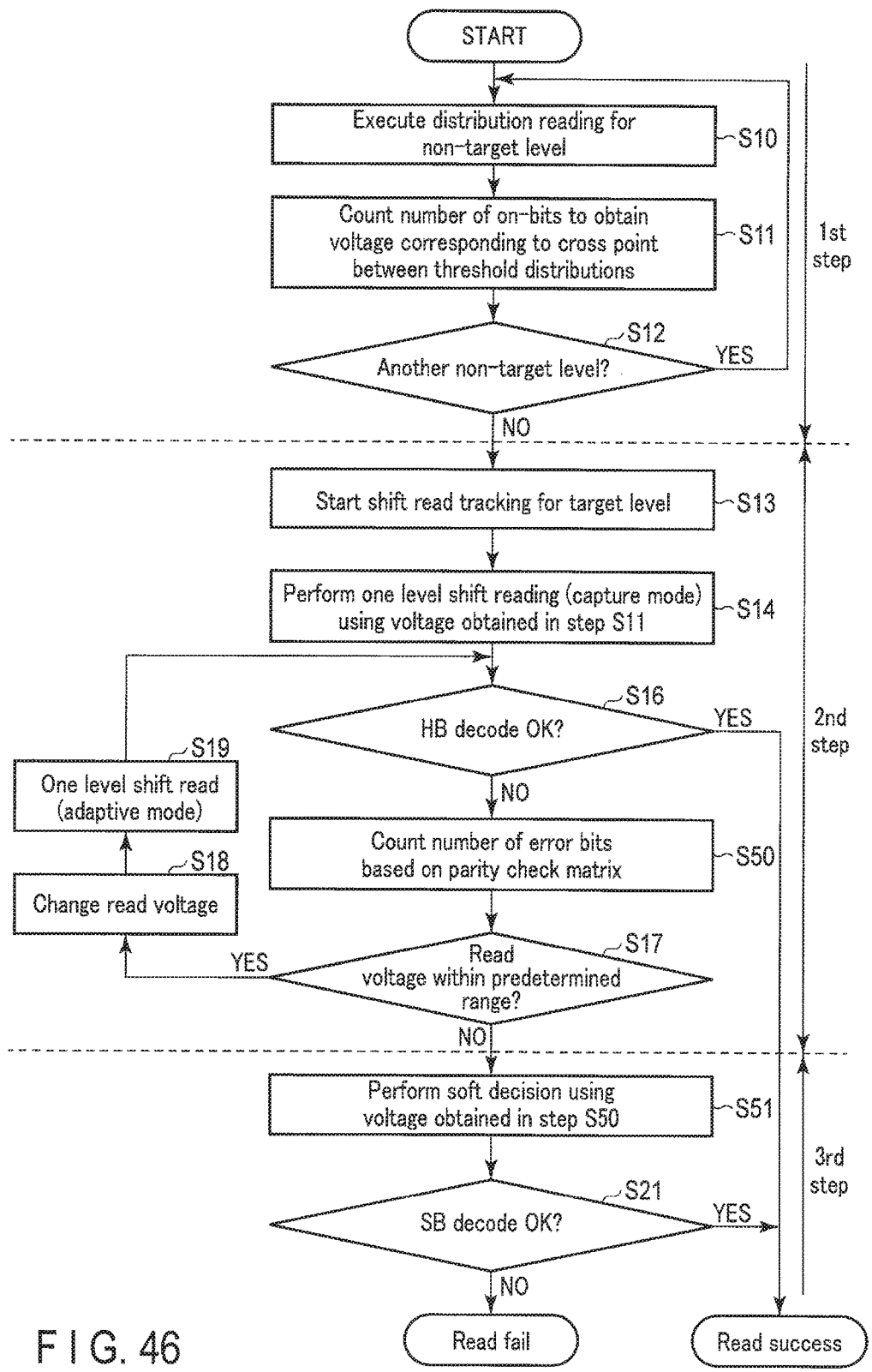
FIG. 46 is a flowchart of a data read operation according to the fifth embodiment.

Retry reading according to this embodiment will be described with reference to FIG. 46. FIG. 46 shows an operation performed when error correction fails in a normal read operation, and corresponds to FIG. 8 described in the first embodiment.

As shown in FIG. 46, the method according to this embodiment is different from the first embodiment in the following points. That is, (1) if hard bit decoding fails (NO in step S16), the ECC circuit 260 counts the number of error bits based on a parity check matrix, and decides the read voltage of the smallest count as the optimal read voltage for the target level (step S50). FIG. 47 shows this state.

As shown in FIG. 47, data of one page read from the memory cell array includes net data and parity. The ECC circuit 260 generates a parity check matrix as shown in FIG. 47 from the parity and net data. In this parity check matrix, an XOR operation of bits at positions with values "1" is performed, thereby obtaining a parity check formula. In the parity check formula, "1" represents an error, and the total number of bits "1" is the total number of errors.

A method of detecting an error bit based on a parity check matrix is described in, for example, U.S. patent application Ser. No. 14/337,372 filed on Jul. 22, 2014 and entitled "MEMORY CONTROLLER, STORAGE DEVICE, AND MEMORY CONTROL METHOD". This patent application is entirely incorporated herein by reference.

(2) In the third step, soft decision is performed using the optimal read voltage obtained in step S50 (step S51). That is, for example, for a non-target level, soft bit reading is performed using a plurality of voltage values based on the voltage obtained in step S11. For a target level, soft bit reading is performed using a plurality of voltage values based on the voltage obtained in step S50.

5.2 Effects According to this Embodiment

According to this embodiment, the optimal read voltage of the target level may be detected not by the number of on-bits but by the number of error bits obtained from the parity check formula. According to this example, unlike bit count by various methods such as distribution reading, the number of error bits is directly counted, and the optimal read voltage is detected based on the number of error bits. For example, a voltage with the smallest number of error bits is defined as the optimal read voltage. It is therefore possible to more accurately detect the optimal read voltage. If this is applied to the read level VA described in the third embodiment, a conspicuous effect may be obtained.

6. Modifications

As described above, a memory system according to the embodiment includes: a semiconductor memory device (100 in FIG. 1) with a memory cell array including a memory cell capable of holding data; and a controller (200 in FIG. 1) capable of issuing a first read instruction to read data from the semiconductor storage device and a second read instruction different from the first read instruction. The memory cell array includes: a first memory cell and a second memory cell; a first bit line connected to the first memory cell; and a second bit line connected to the second memory cell. When receiving the first read instruction (YYh in FIG. 11) from the controller, the semiconductor memory device applies a first voltage (VPRE) to the first bit line (BL0-BL3 in FIG. 18) and the second bit line (BL4-BL7 in FIG. 18) and issues a strobe signal (STB in FIG. 13) at a first timing (t3 in FIG. 13) to read data from the first memory cell and the second memory cell. When receiving the second read instruction (XXh in FIG. 12) from the controller, the semiconductor memory device applies a second voltage (0 V) different from the first voltage (VPRE) to the first bit line (BL0-BL3 in FIG. 25) to set the first memory cell to a non-read target (FIG. 25) and applies the first voltage (VPRE) to the second bit line (BL4-BL7 in FIG. 25) to read data from the second memory cell based on a strobe result of the data at the first timing.

Note that the above-described embodiments may variously be modified. For example, in the above embodiments, 1-level shift read tracking that tracks only one of a plurality of read levels necessary for obtaining data of one page has been described as an example. For example, in middle page reading, of the voltages VB, VD, and VF, only the voltage VF is actually tracked. However, tracking may be performed for all read levels by the method described in the above embodiments. For example, in the middle page, the operation shown in FIG. 13 may be performed for the voltage VF, the operation shown in FIG. 14 may be performed for the voltage VD, and the operation shown in FIG. 15 may be performed for the voltage VB. If 1-level shift read tracking cannot correct data, all read levels may be tracked. At this time, the shift amount (ΔDAC) of the voltage may be smaller than in 1-level shift read tracking.

A detailed operation of the column control circuit 140 has been explained as the second embodiment. However, the description of the second embodiment is merely an example, and the operation is not limited to the described operation. That is, it is only necessary that read data and lockout information needed in the adaptation mode are stored in the capture mode, and the stored information can be used in the adaptation mode.

In the above embodiments, an example in which soft decision (soft bit decoding) is performed if hard decision (hard bit decoding) fails has been described. However, the soft decision may be not performed. In this case, counting of the number of on-bits described concerning steps S11 and S15 of FIGS. 8 and 41 and counting of the number of error bits described concerning step S50 of FIG. 46 are unnecessary.

In the above embodiments, an example in which the memory cell transistor MT holds 3-bit data has been described. However, the memory cell transistor MT may hold 2-bit data or data of four or more bits, as a matter of course.

In the above embodiments, a NAND flash memory has been exemplified as the semiconductor memory device. However, the embodiments are applicable not only to the NAND flash memory but also other general semiconductor memories, and also applicable to various kinds of storage devices other than the semiconductor memories. In the flowcharts described in the above embodiments, the order of processes may be changed as long as it is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
  a semiconductor memory device including a memory cell array; and
  a controller capable of issuing a first read instruction and a second read instruction different, from the first read instruction, wherein the memory cell array includes:
  a first memory cell and a second memory cell;
  a first bit line connected to the first memory cell; and
  a second bit line connected to the second memory cell, and
  wherein when receiving the first read instruction, the semiconductor memory device applies a first voltage to the first bit line and the second bit line and issues a strobe signal at a first timing to read data from the first memory cell and the second memory cell, and
  when receiving the second read instruction, the semiconductor memory device applies a second voltage different from the first voltage to the first bit line to set the first memory cell to a non-read target and applies the first voltage to the second bit line to read data from the second memory cell based on a strobe result of the data at the first timing.

2. The system according to claim 1, wherein when receiving the first read instruction, the semiconductor memory device issues a strobe signal at a second timing different from the first timing to read data from the first memory cell and the second, memory cell.

3. The system according to claim 2, wherein the second timing is later than the first timing.

4. The system according to claim 2, wherein the semiconductor memory device reads data in units of page,
  one page data is determined using a plurality of read levels,
  at the first timing, the data is determined using a first read level, and
  at the second timing, the data is determined using a second read level different from the first read level.

5. The system according to claim 4, wherein when the second read instruction is issued, the semiconductor memory device determines the data using the second read level without using the first read level.

6. The system according to claim 5, wherein the memory cell array further includes a word line connected to the first memory cell and the second memory cell, and when receiving the first read instruction, the semiconductor memory device applies a third voltage different from the first voltage and the second voltage to the word line at the second timing, and when receiving the second read instruction, the semiconductor memory device applies a fourth voltage different from the third voltage to the word line.

7. The system according to claim 4, wherein the first read instruction and the second read instruction designate the same page as a read target.

8. The system according to claim 7, wherein the number of issuing the strobe signal of the semiconductor memory device when receiving the first read instruction is larger than the number of issuing the strobe signal when receiving the second read instruction.

9. The system, according to claim 8, wherein the semiconductor memory device further includes a latch circuit configured to hold the strobe result at the first-timing, and when receiving the second read instruction, the semiconductor memory device outputs data based on a data read result from the second memory cell and the strobe result held by the latch circuit to the controller as data of one page.

10. A memory system comprising:

a semiconductor memory device including a memory cell array and configured to read data from the memory cell array in units of page; and a controller capable of issuing a first read instruction to read first page data from the semiconductor memory device and a second read instruction different from the first read instruction, wherein the one page data is determined using a plurality of read levels, when receiving the first read instruction, the semiconductor memory device issues a strobe signal a first number of times, and when receiving the second read instruction, the semiconductor memory device issues the strobe signal a second number of times, and the first number of times is a natural number not less than 2, and the second number of times is smaller than the first number of times.

11. The system according to claim 10, wherein the first page data is determined using N read levels, the semiconductor memory device issues the strobe signal N times when receiving the first read instruction, and N is a natural number not less than 2.

12. The system according to claim 11, wherein the semiconductor memory device applies voltages different from each other to a selected word line at each timing at which the strobe signal is issued N times.

13. The system according to claim 12, wherein the voltages applied to the selected word line correspond to the N read levels.

14. The system according to claim 13, wherein the semiconductor memory device issues the strobe signal M times when receiving the second read instruction, a voltage applied to the selected word line at a timing at which the strobe signal is issued M times is different from the voltages applied to the selected word line at, each timing at which the strobe signal is issued N times, and M is a natural number not less than 1.

15. The system according to claim 14, wherein the strobe signal issued M times corresponds to one of the N read levels, and for remaining read levels, a read result for the first read instruction is used.

16. A memory system comprising:

a semiconductor memory device including a memory cell array; and a controller capable of issuing a first read instruction to read data from the semiconductor memory device in units of page and a second read instruction different from the first read instruction, wherein the memory cell array includes:

a first memory cell; and a first, word line connected to the first memory cell, and wherein when receiving the first read instruction from the controller, the semiconductor memory device sequentially applies a first voltage and a second voltage different from the first voltage to the first word line and strobes data for each voltage to determine data of a first page, and sets data obtained using the strobe result when the first voltage is used without using the strobe result when the second voltage is used, and when receiving the second read instruction from the controller, the semiconductor memory device applies a third voltage different from the first voltage and the second voltage to the first word line to strobe data, and determines data of the first page based on the strobe result and the data in the latch circuit.

17. The system according to claim 16, wherein the controller executes error detection processing of the determined data.

18. The system according to claim 17, wherein the controller detects an error in the data of the first page obtained in response to the first read instruction, and if the error is not corrected, issues the second read instruction.

19. The system according to claim 18, wherein the controller detects an error in the data of the first page obtained in response to the second read instruction, and if the error is not corrected, issues a third read instruction, and when the third read instruction is issued, a fourth voltage different from the first voltage, the second voltage, and the third voltage is applied to the word line to strobe the data, and the data of the first, page is determined based on the strobe result and the data, in latch circuit.

20. The system according to claim 16, wherein the first page is determined based on at least a first read level and a second read level, the first voltage and the second voltage correspond to the first read level and the second read level, the third voltage corresponds to the second read level, and when the second read instruction is received, data read using the first voltage is used as read data corresponding to the first read level.

* * * * *